(12) United States Patent
Matyjaszewski et al.

(10) Patent No.: US 9,410,020 B2
(45) Date of Patent: Aug. 9, 2016

(54) PROCESSABLE SELF-ORGANIZING NANOPARTICLE

(71) Applicant: CARNEGIE MELLON UNIVERSITY, Pittsburgh, PA (US)

(72) Inventors: Krzysztof Matyjaszewski, Pittsburgh, PA (US); Michael Bockstaller, Pittsburgh, PA (US)

(73) Assignee: CARNEGIE MELLON UNIVERSITY, Pittsburgh, PA (US)

( * ) Notice: Subject to any disclaimer, the term of this patent is extended or adjusted under 35 U.S.C. 154(b) by 0 days.

(21) Appl. No.: 14/373,553

(22) PCT Filed: Jan. 28, 2013

(86) PCT No.: PCT/US2013/023421
§ 371 (c)(1),
(2) Date: Jul. 21, 2014

(87) PCT Pub. No.: WO2013/158183
PCT Pub. Date: Oct. 24, 2013

(65) Prior Publication Data
US 2015/0005452 A1    Jan. 1, 2015

Related U.S. Application Data

(60) Provisional application No. 61/632,643, filed on Jan. 27, 2012.

(51) Int. Cl.
*C08L 33/12*    (2006.01)
*C08J 3/02*    (2006.01)
(Continued)

(52) U.S. Cl.
CPC ............... *C08J 3/02* (2013.01); *B81C 1/00031* (2013.01); *C08J 3/005* (2013.01); *C08L 25/06* (2013.01);
(Continued)

(58) Field of Classification Search
CPC ... B82Y 30/00; C08L 101/005; C08G 83/003
See application file for complete search history.

(56) References Cited

U.S. PATENT DOCUMENTS

| 5,763,548 A | 6/1998 | Matyjaszewski |
| 5,789,487 A | 8/1998 | Matyjaszewski |

(Continued)

FOREIGN PATENT DOCUMENTS

| WO | WO0228912 A2 | 4/2002 |
| WO | WO2008062975 A1 | 5/2008 |
| WO | WO2013158183 A2 | 10/2013 |

OTHER PUBLICATIONS

Voudouris, Panayiotis et al., Anisotropic Elasticity of Quasi-One-Component Polymer Nanocomposites, Acsnano, 2011, vol. 5, No. 7, 5746-5754.

(Continued)

*Primary Examiner* — Michael A Salvitti
(74) *Attorney, Agent, or Firm* — Bartony & Associates, LLC.

(57) ABSTRACT

A method of forming a composition includes adding together a plurality of particle brush systems wherein each of the particle brush systems includes a particle and a polymer brush including a plurality of polymer chains attached to the particle. The plurality of polymer chains of the polymer brush exhibit two chain conformations as the degree of polymerization of the polymer chains increases so that the polymer brush includes a concentrated polymer brush region with stretched polymer chains and a semi-dilute polymer brush region with relaxed chains that is radially outside of the concentrated polymer brush region. The degree of polymerization of the polymer brush is no less than 10% less than a critical degree of polymerization and no more than 20% greater than the critical degree of polymerization. The critical degree of polymerization is defined as the degree of polymerization required to achieve a transition from the concentrated polymer brush region to the semi-dilute polymer brush region.

24 Claims, 14 Drawing Sheets

(51) Int. Cl.
*B81C 1/00* (2006.01)
*C08J 3/00* (2006.01)
*C08L 25/06* (2006.01)
*C08G 83/00* (2006.01)
*C08L 101/00* (2006.01)
*B82Y 30/00* (2011.01)

(52) U.S. Cl.
CPC .......... *C08L 33/12* (2013.01); *B81B 2207/056* (2013.01); *B81C 2201/0149* (2013.01); *B82Y 30/00* (2013.01); *C08G 83/003* (2013.01); *C08J 2325/06* (2013.01); *C08J 2333/12* (2013.01); *C08L 101/005* (2013.01); *C08L 2205/025* (2013.01)

(56) References Cited

U.S. PATENT DOCUMENTS

| | | |
|---|---|---|
| 5,807,937 A | 9/1998 | Matyjaszewski |
| 5,945,491 A | 8/1999 | Matyjaszewski |
| 6,111,022 A | 8/2000 | Matyjaszewski |
| 6,121,371 A | 9/2000 | Matyjaszewski |
| 6,124,411 A | 9/2000 | Matyjaszewski |
| 6,162,882 A | 12/2000 | Matyjaszewski |
| 6,407,187 B1 | 6/2002 | Matyjaszewski |
| 6,512,060 B1 | 1/2003 | Matyjaszewski |
| 6,538,091 B1 | 3/2003 | Matyjaszewski |
| 6,541,580 B1 | 4/2003 | Matyjaszewski |
| 6,624,262 B2 | 9/2003 | Matyjaszewski |
| 6,624,263 B2 | 9/2003 | Matyjaszewski |
| 6,627,314 B2 | 9/2003 | Matyjaszewski |
| 6,759,491 B2 | 7/2004 | Matyjaszewski |
| 6,790,919 B2 | 9/2004 | Matyjaszewski |
| 6,887,962 B2 | 5/2005 | Matyjaszewski |
| 7,019,082 B2 | 3/2006 | Matyjaszewski |
| 7,049,373 B2 | 5/2006 | Matyjaszewski |
| 7,064,166 B2 | 6/2006 | Matyjaszewski |
| 7,125,938 B2 | 10/2006 | Matyjaszewski |
| 7,157,530 B2 | 1/2007 | Matyjaszewski |
| 7,332,550 B2 | 2/2008 | Matyjaszewski |
| 7,572,874 B2 | 8/2009 | Matyjaszewski |
| 7,678,869 B2 | 3/2010 | Matyjaszewski |
| 7,795,355 B2 | 9/2010 | Matyjaszewski |
| 7,825,199 B1 | 11/2010 | Matyjaszewski |
| 7,893,173 B2 | 2/2011 | Matyjaszewski |
| 7,893,174 B2 | 2/2011 | Matyjaszewski |
| 8,252,880 B2 | 8/2012 | Matyjaszewski |
| 8,273,823 B2 | 9/2012 | Matyjaszewski |
| 8,349,410 B2 | 1/2013 | Huang |
| 8,367,051 B2 | 2/2013 | Matyjaszewski |
| 8,445,610 B2 | 5/2013 | Kwak |
| 2007/0155926 A1 | 7/2007 | Matyjaszewski |
| 2007/0197693 A1 | 8/2007 | Ok |
| 2008/0057310 A1* | 3/2008 | Ohno et al. ............. 428/402 |
| 2011/0060107 A1 | 3/2011 | Matyjaszewski |
| 2015/0005452 A1* | 1/2015 | MatyJaszewski et al. .... 525/227 |

OTHER PUBLICATIONS

Ojha, Satyajeet et al., Impact of Polymer Graft Characteristics and Evaporation Rate on the Formation of 2-D Nanoparticle Assemblies, Langmuir 2010, 26(16), 13210-13215.
Choi, Jihoon et al., Flexible Particle Array Structures by Controlling Polymer Graft Architecture, J. Am. Chem. Soc. 2010, 132, 12537-12539.
Wilmer, E. et al., Nanoscale Forces and their Uses in Self-Assembly, Small, 2009, 5, 1600-1630.
Min, Y. et al., The Role of Interparticle and External Forces in Nanoparticle Assembly, Nat. Mater., 2008, 7, 527-538.
Pauchard, L. et al., Influence of Mechanical Properties of Nanoparticles on Macrograde Formation, Langmuir, 2009, 25, 6672-6677.
Ngo, A. T. et al., Crack in Magnetic Nanocrystal Films: Do Directional and Isotropic Crack Patterns Follow the Same Scaling Law?, Nano Lett., 2008, 8, 2485-2489.
Mueggenburg, K. E., et al., Elastic Membranes of Close-Packed Nanoparticle Arrays, Nat. Mater. 2007, 6, 656-660.
Pyun, J., et al., Synthesis of Nanocomposite Organic/Inorganic Hybrid Materials Using Controlled/Living Radical Polymerization, Chemistry of Materials 2001, 13, 3436-3448.
Pyun, J., et al., Polymer Brushes by Atom Transfer Radical Polymerization, Polymer Brushes 2004, 51-68.
Bockstaller, M. R., et al., Size-Selective Organization of Enthalpic Compatibilized Nanocrystals in Ternary Block Copolymer/Particle Mixtures, Chem. Soc. 2003, 125, 5276-5277.
Bockstaller, M. R., et al., Optical Properties of Polymer-Based Photonic Nanocomposite Materials, J. Phys. Chem. B 2003, 107, 10017-10024.
Bombalski, L., et al., Structure, Properties and Opportunities of Block Copolymer/Particle Nanocomposites, Annu. Rev. Nano Res. 2006, 1, 295-336.
Bbombalski, L., et al., Null-Scattering Hybrid Particles Using Controlled Radical Polymerization, Advanced Materials 2007, 19, 4486-4490.
Voudouris, P., et al., Effect of Shell Architecture on the Static and Dynamic Properties of Polymer-Coated Particles in Solution, Macromolecules 2009, 42, 2721-2728.
Matyjaszewski, K; et al. Polymers at Interfaces Using Atom transfer Radical polymerization in the Controlled Growth of Homopolymers and Block Copolymers from Silicon Surfaces in the Absence of Untethered Sacrificial Initiator, Macromolecules 1999, 32, 8716-8724.
Ojha, S., et al, Impact of Polymer Graft Characteristics and Evaporation rate on the Formation of 2-D nanoparticle Assemblies, Langmuir 2010, 26, 13210-5.
Matyjaszewski, K., et al., J. Atom transfer radical Polymerization, Chem. Rev. 2001, 101, 2921-2990.
Tsarevsky, N. V., et al, "Green" Atom Transfer Radical polymerization; From Process Design to Preparation of Well-Defined Environmentally Friendly Polymeric Materials, Chem. Rev. 2007, 107, 2270-2299.
Braunecker, W. A., et al.,Controlled/Living Radical Polymerization: Features, developments, and Perspectives, Prog. Polym. Sci. 2007, 32, 93-146.
Daoud, M., et al., Star Shaped Polymers: A Model for the Conformation and its Concentration Dependence, J. Physique, 1982, 43, 531-538.
Takeshi; Surface Interaction Forces of Well-Defined, High-Density Polymer Brushes Studied by Atomic Force Microscopy. 1. Effect of Chain Length, Macromolecules (2000), 33(15), 5602-5607.
Yoshikawa, Chiaki, et al, Size-Exclusion Effect and Protein Repellency of Concentrated Polymer Brushes Prepared by Surface-Initiated Living Radical Polymerization, Macromolecular Symposia (2007), 248, 189-198.
Ohno, Kohji, et al., Suspensions of Silica Particles Grafted with Concentrated Polymer Brush: Effects of Graft Chain Length on Brush Layer Thickness and Colloidal Crystalization, Macromolecules, (2007), 40(25), 9143-9150.
Ohno, K., Colloidal Crystals Formed by Polymer Brush-Afforded Fine Particles, Polym. Chem. 2010, 1, 1545-1551.
Wijmans, C.M. et al., Polymer Brushes at Curved Surfaces, Macromolecules, 1993, 26, 7214-7224.
Scheutjens, J.M.H.M et al., Statistical Theory of the Adsorption of Interacting Chain Molecules. 1. Partition Fuction, Segment Density Distribution, and Adsorption Isotherms, J Phys. Chem, 1979, 83, 1619-1635.
Pietrasik, J., et al., Silica-Polymethacrylate Hybrid Particles Synthesized Using High Pressure Atom Transfer Radical Polymerization, Macromol. Rapid Commun. 2011, 32, 295-301.
Leermakers, F.A.M. et al., Statistical Thermodynamics of Association Colloids. 2. Lipid Vesides, J. Phys. Chem., 1989, 93, 7417-7426.
Montoro, Gil J.C. et al., The Vorondi Polyhedra as Tools for Structure Determination in Simple Disordered Systems,J. Phys. Chem. 1993, 97, 4211-4215.
Sharpless, K. Barry et al.; Click Chemistry: Diverse Chemical Function from a Few Good Reactions, Angewandte Chemie International Edition 40 (11): 2004-2021 (2001).
Wool, R. P., et al., Welding of Polymer Interfaces, Polym. Eng. Sci., 1989, 29, 1340-1367.

(56) References Cited

OTHER PUBLICATIONS

Fogg, D. E., et al., Fabrication of of Quantum Dot-polymer Composites: Semiconductor Nanoclusters Dual-Function Polymer Matrices with Electron-Transporting and Cluster-Passivating Properties, Macromolecules, 1997, 30: p. 8433-8439.

Wu, M., et al., Electron Transfer and Fluorescence Quenching of Nanoparticles Assemblies, The Journal of Physical Chemistry C, 2010, 114(13): p. 5751-5759.

Fogg, D. E., et al., Fabrication of Quantum Dot/polymer Composites: Phosphine-Functionalized Block Copolymers as Passivaring Hosts for Cadmium Selenide Nanoclusters, Macromolecules, 1997, 30(3): p. 417-426.

Choi, J., et al., Toughening Fragile Matter: Mechanical Properties of Particle Solids Assembled from Polymer-Grafted Hybrid Particles Synthesized by ATRP, Soft Matter 2012, 8, 4072-4082.

* cited by examiner

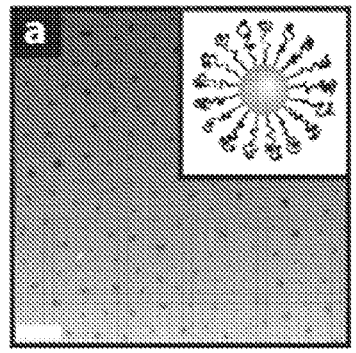 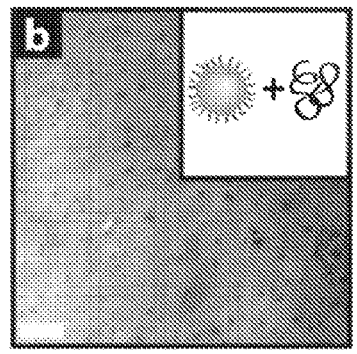
Fig. 3A          Fig. 3B
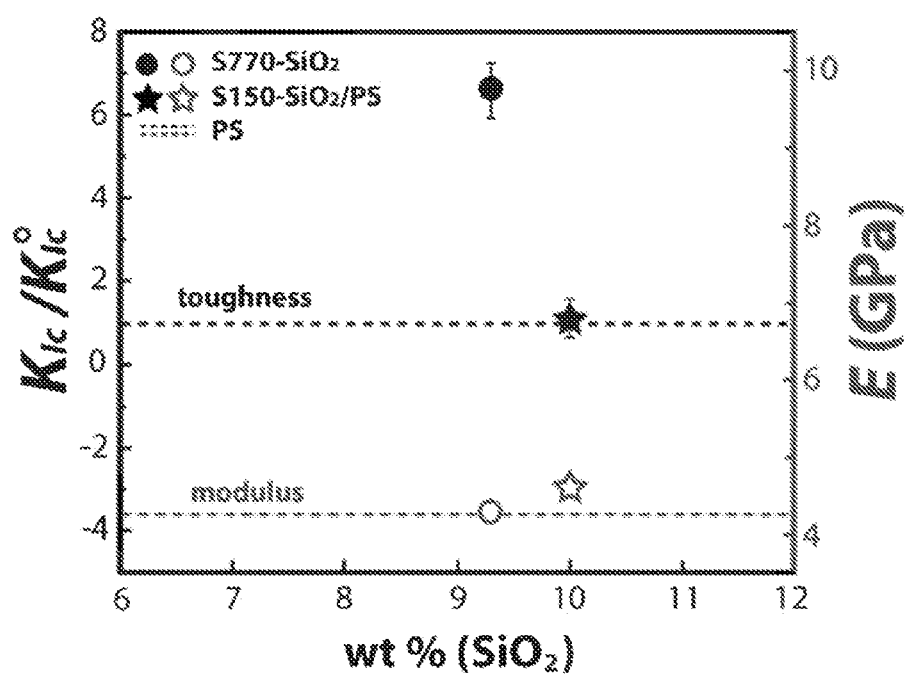
Fig. 3C

PROCESSABLE SELF-ORGANIZING NANOPARTICLE

CROSS-REFERENCE TO RELATED APPLICATION

This application is a US National Phase of the International PCT patent application number: PCT/US2013/023421 filed on Jan. 28, 2013, which claims benefit of U.S. Provisional Patent Application Ser. No. 61/632,643, filed Jan. 27, 2012, the disclosures of which are incorporated herein by reference.

GOVERNMENTAL INTEREST

This invention was made with government support under grant no. FA9550-09-1-0169 awarded by the Air Force Office for Scientific Research and grant no. EEC-0836633 awarded by the National Science Foundation. The government has certain rights in this invention.

BACKGROUND

The following information is provided to assist the reader in understanding technologies disclosed below and the environment in which such technologies may typically be used. The terms used herein are not intended to be limited to any particular narrow interpretation unless clearly stated otherwise in this document. References set forth herein may facilitate understanding of the technologies or the background thereof. The disclosures of all references cited herein are incorporated by reference.

Despite enormous progress in the ability to tailor the overall properties of nanoscopic particles, the ability to fabricate solid particle assembly structures targeting potential applications (for example, in optoelectronic devices, photovoltaics, and medical diagnostics) is limited because of difficulties associated with the processing of individual nanocrystalline materials into solid material assemblies over large length scales. These difficulties have severely limited scale-up of current assembly processes for technological applications.

The most common technique to form large-area two-dimensional (2D) or three-dimensional (3D) periodic superlattice structures, materials with an arrangement of particles with regular interparticle distance, is based on the self-assembly of ligand-coated particles in which the building blocks with controlled size and shape could/should spontaneously assemble into hierarchically organized structures through thermodynamic driving forces toward the equilibrium state. As used herein the term "superlattice" refers to a material that is compositionally modulated in a generally regular manner. Superlattices are periodic structures or layers of two (or more) materials. As used herein, the term "ligand", refers to an organic material tethered to the surface of a particle that can alter the solubility or miscibility of the particle in a solvent or other materials. Superlattice structures include materials with an arrangement of particles with regular interparticle distance. However, the inherent nature of surface chemistry (for example, similarity in the chemical compositions and effective molecular volume) in the synthesis of nanoparticles imposes a constraint on the secondary intermolecular interactions. These constraints result in uncontrolled defect formation such as crack formation in the macroscopic particle structures. The ubiquitous existence of defects arising from self-assembly only utilizing weak cohesive forces (for example, van der Waals interactions) during the processing of the particle solids has resulted in limited progress in this field. Reports of procedures utilizing careful control of evaporative deposition conditions, or use of topologically patterned templates, each require extensive post-processing of particle films. See, for example, *Small*, 2009, 5, 1600-1630; *Nat. Mater.*, 2008, 7, 527-538; *Langmuir*, 2009, 25, 6672-6677; *Nano Lett.*, 2008, 8, 2485-2489.

The creation of large-scale particle film assemblies without non-equilibrium defects (such as crack formation during solvent evaporation that is driven by compressive stresses that arise during film shrinkage and domain disorientation) is necessary for high volume applications of particle assembly structures. However, previous studies report the fragile nature of particle assemblies to be a universal feature of such particle assemblies. There is thus a substantial demand to develop particle assemblies with improved cohesive interactions within particle assembly structures that do not require extensive post-processing of particle films.

The mechanical properties of films formed from solid particles including varying ligand systems has been attributed to a dominant role of dispersion interactions between the surface-bound ligands on the elastic properties of the particle array. See, *Nat. Mater.* 2007, 6, 656-660. Based on this attribution, the similar elastic characteristics of particle assemblies including different surfactant coatings may be explained as a consequence of the small interaction volumes, and the associated small molecular polarizability of the low molecular weight ligands that are bound to the particle surface. As a result of the small interaction volumes, and associated low levels of polarizability of low-molecular weight ligands, low values for both the elastic modulus ($\leq 3$ GPa) and hardness ($\leq 0.1$ GPa) have been observed for a wide range of surfactant systems such as oleic acid, trioctylphosphine, and dodecanethiol. The toughness of those particle solid structures was found to be of the order of 50 kPa $m^{1/2}$, significantly lower than even brittle inorganic glasses.

As used herein 'toughness' describes the ability of a material to absorb energy during fracture. Low toughness values indicate more brittle fracture characteristics. Low toughness values are consistent with the widely observed susceptibility of particle solids to form cracks during fabrication. The development of techniques to increase the cohesive interactions within particle assembly structures without the need of extensive post-processing of particle films is thus an important prerequisite for broadening the range of applications for nanoparticle solids (for example, novel optical materials) that derive their properties from molecular interactions within particle superlattice structures.

Procedures to prepare hybrid particles including polymer grafts have, for example, been described in *Chemistry of Materials* 2001, 13, 3436-3448, WO 2002028912, *Polymer Brushes* 2004, 51-68, *J. Am. Chem. Soc.* 2003, 125, 5276-5277, *J. Phys. Chem. B* 2003, 107, 10017-10024, *Annu. Rev. Nano Res.* 2006, 1, 295-336 *Advanced Materials* 2007, 19, 4486-4490, *Macromolecules* 2009, 42, 2721-2728, *J. Am. Chem. Soc.* 2010, 132, 12537-12539, and *Langmuir* 2010, 26, 13210-5, the disclosures of which are incorporated herein by reference. Investigations have, for example, studied the effect of the architecture of polymer grafts on the static and dynamic properties of polymer-functionalized particle systems in good solvents. Exemplary polystyrene-coated silica particle brush model systems exhibited identical hard core diameter but distinct polymer-shell architectures corresponding to a concentrated polymer brush (CPB) regime and a semi-dilute polymer brush (SCPB) regime. FIG. 1A, for example, illustrates the CPB and SDPB regimes in the shell of a densely grafted particle brush system with a particle radius $R_0$ and grafting density $\rho_s$. Within the terminology of a theoretical model that has often been used in the literature to analyze the structure of polymer-grafted particle systems, the CPB/SDPB transition occurs (as the molecular weight of the tethered chain increases) at the critical radius $R_c$, which depends on the grafting density, the molecular weight of the grafted chain and the radius of the particle. In the CPB regime, excluded volume interactions give rise to more stretched chain conformations. In the SDPB regime, the chains can begin to enter a more relaxed chain conformation. Although hybrid particles, including inorganic particles with surface tethered polymer grafts, show promise for providing relatively tough particle assemblies, improvements in particle order and mechanical properties thereof, and particularly a combination of relatively high order, improved mechanical properties and facile processability, remain very desirable.

SUMMARY

In one aspect, a method of forming a composition includes adding together a plurality of particle brush systems wherein each of the particle brush systems includes a particle and a polymer brush including a plurality of polymer chains attached to the particle. The plurality of polymer chains of the polymer brush (as modeled in, for example, a scaling model such as described herein) exhibit modeled variable chain conformations as the degree of polymerization of the polymer chains increases so that the polymer brush includes a concentrated polymer brush region with stretched polymer chains and a semi-dilute polymer brush region with relaxed chains that is radially outside of the concentrated polymer brush region. The degree of polymerization of the polymer brush is no less than 10% less than a critical degree of polymerization and no more than 20% greater than the critical degree of polymerization. The critical degree of polymerization is defined as the degree of polymerization required to achieve a transition from the concentrated polymer brush region to the semi-dilute polymer brush region. In a number of embodiments, the degree of polymerization of the polymer brush is no less than 5% less than the critical degree of polymerization and no more than 10% greater than the critical degree of polymerization.

The critical degree of polymerization may, for example, be determined by a change in a scaling factor in a log-log plot of polymer brush height versus degree of polymerization. The critical degree of polymerization $N_c$ may, for example, be determined by the equation $r_c - R_0 = \alpha N_c^x$ wherein $r_c$ is the critical chain length associated with the transition, $R_0$ is the particle radius, $\alpha$ is the length of a repeat unit of the polymer, and x is the scaling factor in the concentrated polymer brush regime, and wherein $r_c = R_0 (\rho_s^*)^{1/2} (v^*)^{-1}$, wherein $\rho_s^* = \rho_s \alpha^2$, wherein $\rho_s$ is the grafting density, and $v^* = v/(4\pi)^{1/2}$, wherein v is the excluded volume parameter.

In a number of embodiments, the composition includes greater than 50% by mass of the particle brush systems. In some embodiments, the composition includes greater than 90% by mass of the particle brush systems.

The composition may, for example, exhibit a toughness exceeding a toughness of a free polymeric material formed from a polymer having the same composition as the polymer brush and having a degree of polymerization within 5% of the degree of polymerization of the polymer brush.

The polymer brush systems may, for example, self organize to form a colloidal crystal. In a number of embodiments, a degree of order of the colloidal crystal is sufficient so that the composition exhibits a reflectivity equal to or exceeding 0.3. The composition may, for example, be a two-dimensional or a three-dimensional (3D) periodic superlattice structure formed by self-assembly of the polymer brush systems.

Parameters of the composition may, for example, be controlled via selection of polymer composition, particle size, polymer dispersity ($M_w/M_n$) and graft density. Polymer dispersity may, for example, be in the range of 1.01 to 2. In a number of embodiments, the polymer dispersity is no greater than 2, no greater than 1.5, no greater than 1.35, no greater than 1.25, or even less. A size dispersity the particles may, for example, be in the range of 1.01 to 2.0. In a number of embodiments, the size dispersity of the particles is no greater than 2, no greater than 1.5, no greater than 1.35, no greater than 1.25, or even less. In a number of embodiments, both polymer dispersity and particle size dispersity are minimized to the extent possible.

In a number of embodiments, the composition may, for example, be processed by at least one polymer-like processing method. The at least one polymer-like processing method may, for example, include one of extrusion, molding, calendering, casting, spray coating, or ink jet printing. The composition may, for example, be processed using the physicochemical properties of the polymer of the polymer brushes.

The particles may be inorganic particles or organic particles. Organic particles may, for example, be formed of crosslinked polymers. In a number of embodiments, the plurality of polymer chains may have a segmented structure so that the particle brush systems organize into periodic domain structures.

The degree of polymerization of the polymer brushes may, for example, be between 10 and 1,000,000. In a number of embodiments, a radius of the particles is in the range of approximately 0.05 nm to 500 nm. In a number of embodiments, the graft density is in the range of, approximately, 0.01 to 1.2 chains/nm$^2$.

The plurality of polymer chains may, for example, be attached to the particle by growing the plurality of polymer chains from active sites on the particle. The plurality of polymer chains may also be attached to the particle or reactive groups on ligands attached to the particle by conducting a "grafting to" reaction.

In a number of embodiments, the particle brush systems of the composition self assembles to provide a center-to-center interparticle distance that varies by no more than 30%, no more than 20%, no more than 10%, no more than 5%, no more than 3% or even no more than 1%. A particle center-to-center variance of no more than X % indicates that the particle center-to-center distance does not vary by more than +/−½X % from the average particle center-to-center distance. For example, a particle center-to-center variance of no more than 30% indicates that the particle center-to-center distance does not vary by more than +/−15% from the average particle center-to-center distance In a number of embodiments, the composition forms or is used within a photonic crystal system or an organized quantum dot system.

In another aspect, a method of forming a composition includes adding together a plurality of particle brush systems wherein each of the particle brush systems includes a particle and a polymer brush including a plurality of polymer chains attached to the particle. The plurality of polymer chains of the polymer brush exhibit modeled variable chain conformations as the degree of polymerization of the polymer chains increases so that the polymer brush has a concentrated polymer brush region with stretched polymer chains and a semi-dilute polymer brush region with relaxed chains that is radially outside of the concentrated polymer brush region. In a number of embodiments the volume fraction of polymer chains in the semi-dilute polymer brush regions does not exceed the available void space of a close packed regular structure formed with adjacent polymer brush systems by greater than 20%. The particle brush systems may, for example, exhibit a polymer dispersity of less than 2.0. In a number of embodiments, the particle brush systems have a polymer dispersity between approximately 1.01 and 2.0 as described above. Likewise, the particle sized dispersity may, for example, be between approximately 1.01 and 2.0 as described above. In a number of embodiments, the particle brush systems exhibit a bimodal dispersity. In a number of embodiments, the particle brush systems of the composition self assembles to provide a center-to-center interparticle distance that varies by no more than 30%, no more than 20%, no more than 10%, or even no more than 5%.

In a another aspect, a composition includes a plurality of particle brush systems wherein each of the particle brush systems comprises a particle and a polymer brush comprising a plurality of polymer chains attached to the particle. The plurality of polymer chains of the polymer brush exhibit modeled variable chain conformations as the degree of polymerization of the polymer chains increases so that the polymer brush comprises a concentrated polymer brush region with stretched polymer chains and a semi-dilute polymer brush region with relaxed chains that is radially outside of the concentrated polymer brush region. The degree of polymerization of the polymer brush is no less than 10% less than a critical degree of polymerization and no more than 20% greater than the critical degree of polymerization, wherein the critical degree of polymerization is defined as the degree of polymerization required to achieve a transition from the concentrated polymer brush region to the semi-dilute polymer brush region.

In a further aspect, a composition includes a plurality of particle brush systems wherein each of the particle brush systems includes a particle and a polymer brush including a plurality of polymer chains attached to the particle. The plurality of polymer chains of the polymer brush exhibit modeled variable chain conformations as the degree of polymerization of the polymer chains increases so that the polymer brush has a concentrated polymer brush region with stretched polymer chains and a semi-dilute polymer brush region with relaxed chains that is radially outside of the concentrated polymer brush region. The volume fraction of polymer chains in the semi-dilute polymer brush region does not exceed the available void space of a close packed regular structure formed by adjacent polymer brush systems by greater than 20%.

In a further aspect, a system includes a composition as described herein. In a number of embodiments, the system is a photonic crystal system or an organized quantum dot system.

The present devices, systems, methods and compositions, along with the attributes and attendant advantages thereof, will best be appreciated and understood in view of the following detailed description taken in conjunction with the accompanying drawings.

BRIEF DESCRIPTION OF THE DRAWINGS

FIG. 3A illustrates a transmission electron microscopy (TEM) image of a "quasi one-component" nanocomposite film.

FIG. 3B illustrates a TEM image of a binary nanocomposite film.

FIG. 3C illustrates toughness (filled symbols) and elastic moduli (open symbols) of quasi-one-component and binary nanocomposites films as a function of weight percent of $SiO_2$ particles.

DETAILED DESCRIPTION

Figure 1A:
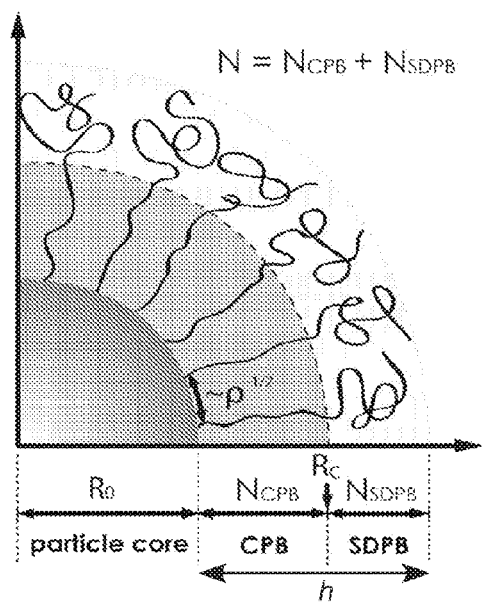
FIG. 1A illustrates schematically concentrated particle brush (CPB)/semi-dilute particle brush (SDPB) regimes or domains in the shell of a densely grafted particle brush system.

It will be readily understood that the components of the embodiments, as generally described and illustrated in the figures herein, may be arranged and designed in a wide variety of different configurations in addition to the described example embodiments. Thus, the following more detailed description of the example embodiments, as represented in the figures, is not intended to limit the scope of the embodiments, as claimed, but is merely representative of example embodiments.

Reference throughout this specification to "one embodiment" or "an embodiment" (or the like) means that a particular feature, structure, or characteristic described in connection with the embodiment is included in at least one embodiment. Thus, the appearance of the phrases "in one embodiment" or "in an embodiment" or the like in various places throughout this specification are not necessarily all referring to the same embodiment.

Furthermore, described features, structures, or characteristics may be combined in any suitable manner in one or more embodiments. In the following description, numerous specific details are provided to give a thorough understanding of embodiments. One skilled in the relevant art will recognize, however, that the various embodiments can be practiced without one or more of the specific details, or with other methods, components, materials, et cetera. In other instances, well known structures, materials, or operations are not shown or described in detail to avoid obfuscation.

As used herein and in the appended claims, the singular forms "a," "an", and "the" include plural references unless the context clearly dictates otherwise. Thus, for example, reference to "polymer brush structure" includes a plurality of such polymer brush structures and equivalents thereof known to those skilled in the art, and so forth, and reference to "the polymer brush structure" is a reference to one or more such polymer brush structures and equivalents thereof known to those skilled in the art, and so forth.

In a number of representative embodiments hereof, polymer nanocomposites are prepared with controlled properties (including, for example, optical and mechanical properties). In a number of embodiments, such polymer nanocomposites may, for example, be processed using one or more processing techniques commonly used in connection with polymeric materials.

Recent progress in controlled/living polymerization processes, particularly controlled radical polymerization, exemplified herein by atom transfer radical polymerization (ATRP) in a number of embodiments, offers novel opportunities for the synthesis of well-defined polymer-stabilized particle systems as building blocks of particle superlattice structures. Living polymerization is generally considered in the art to be a form of chain polymerization in which irreversible chain termination is substantially absent. An important feature of living polymerization is that polymer chains will continue to grow while monomer and reaction conditions to support polymerization are provided. Polymer chains prepared by living polymerization can advantageously exhibit a well-defined molecular architecture, a predetermined molecular weight and narrow molecular weight distribution or low polydispersity. Examples of living polymerization include ionic polymerization and controlled radical polymerization (CRP) in which termination cannot be completely avoided but can be strongly suppressed, in comparison with conventional radical polymerization. Examples of CRP include, but are not limited to, iniferter polymerization, stable free radical mediated polymerization (SFRP), atom transfer radical polymerization (ATRP), and reversible addition fragmentation chain transfer (RAFT) polymerization.

ATRP is considered to be one of the most successful controlled radical polymerization processes with significant commercial potential for production of many specialty materials including coatings, sealants, adhesives, dispersants, materials for health and beauty products, electronics and biomedical applications. The process, including suitable transition metals and state of the art ligands, range of polymerizable monomers and materials prepared by the process, has been thoroughly described in a series of co-assigned U.S. patents and applications including U.S. Pat. Nos. 5,763,548; 5,807,937; 5,789,487; 5,945,491; 6,111,022; 6,121,371; 6,124,411; 6,162,882; 6,407,187; 6,512,060; 6,538,091; 6,541,580; 6,624,262; 6,624,263; 6,627,314; 6,759,491; 6,790,919;

6,887,962; 7,019,082; 7,049,373; 7,064,166; 7,125,938; 7,157,530; 7,332,550; 7,572,874; 7,678,869; 7,795,355; 7,825,199; 7,893,173; 7,893,174, 8,252,880, 8,273,823; and 8,349,410 and U.S. patent application Ser. Nos. 10/548,354; 12/311,673; 12/921,296; 12/877,589; 12/949,466; 13/026,919; 13/260,504 and 13/390,470 all of which are herein incorporated by reference. These prior art patents describe the range of (co)polymerizable monomers and procedure to control the topology, architecture and ability to incorporate site specific functionality into copolymers prepared by ATRP in addition to detailing a range of composite structures that can be prepared by "grafting from" or "grafting to" a broad range of organic or inorganic materials.

ATRP has also been discussed in numerous publications with Matyjaszewski as co-author and reviewed in several book chapters including *Chem. Rev.* 2001, 101, 2921-2990; *Chem Rev* 2007, 107, 2270-2299 and Prog. Polym. Sci., 2007, 32, 93-146. These publications are included in order to describe the state of the art in CRP or other living polymerization procedures not to limit the procedure for grafting from a particle surface to ATRP.

The inventors have established, using, for example, combined experimental and theoretical approaches, that the effect of polymer-graft architecture (that is, the graft density and degree of polymerization of surface-grafted chains as well as the particle radius) on the ability of polymer-grafted particle systems (sometimes referred to herein as a "particle brushes" or a "particle brush systems") to organize into ordered yet tough particle array structures. A comparison with the structure and the hydrodynamic factors of hard-sphere suspensions underlined the role of significant interpenetration of the grafted polymer chains for the particles in the SDPB regime. In particular, for high concentrations the threshold concentration for graft-polymer interpenetration of dense particle brushes, evidenced by the emergence of a fast cooperative relaxation mode and a slow particle self-diffusion, is increased by about an order of magnitude as compared to the semi-dilute brush analog. Light scattering studies on semi-dilute particle brush systems thus demonstrate a characteristic feature that can be attributed to the interpenetration of grafted chains, supporting the interpretation that, in the SDPB limit, chains entangle and the materials thus have improved mechanical properties and processability.

In a number of embodiments hereof, it has been shown that chain entanglements between/among surface-grafted polymer chains significantly increase the cohesive interaction within particle array structures and give rise to fracture through polymer-like crazing, thus increasing the toughness and flexibility of particle assembly structures by orders of magnitude.

Furthermore, in other embodiments hereof, it is demonstrated that there is a region within self-assembled well-defined polymer-particle structures wherein relatively highly ordered particle films exhibiting plastic properties can be fabricated by, for example, simple solvent evaporation and other scalable film forming procedures.

In other embodiments, modification of particles with polymer grafts of appropriate molecular weight and grafting density, (that is, the synthesis of polymer brush systems), via controlled or "living" polymerization procedures provides a path towards the formation of robust ordered particle assembly structures with polymer-like cohesive interactions that are amenable to polymer-like processing techniques such as, for example, extrusion, molding, casting and spray-coating, thereby forming, for example, a self-sustaining film or a robust coating on a selected substrate.

These and other embodiments hereof reduce or eliminate major technological barriers that impede the development of a number of technologies (including, for example, photonic coating applications) and thus provide new opportunities for the commercialization of such technologies (for example, optically active coatings or paints).

As disclosed herein, tethering polymers to the surface of solid particles provides a versatile means to facilitate the production of uniform dispersions of nanocomposites in scalable fabricated materials. The inventors have determined that the self-assembly of particle brush systems with controlled particle/polymer-graft architecture (for example, the graft density and degree of polymerization) of surface-grafted chains as well as the particle radius, interact to control the ability of polymer-grafted particle systems to organize into ordered and tough particle array structures that provide nanocomposite materials with, for example, advanced mechanical and optical properties as well as precisely controlled microstructure.

The toughness of particle brush solids in the semi-dilute particle brush (SDPB) regime was found to significantly exceed the toughness that would be expected for corresponding homopolymers with molecular weight equal to the surface-grafted chains. In a number of embodiments, the toughness of the formed film or article exceeds that of a polymer of the same composition and molecular weight as the grafted chains by greater than 30%, greater than 50% or by even a larger percentage.

As discussed above, the particle-brush system approach (with, for example, controlled graft density and controlled molecular weight, both related to the radius of the particle), resolves major technology barriers that impede the development and commercialization of a number of technologies. Based on a systematic evaluation of the effect of polymer graft modification on the deformation characteristics of particle solids (with an appropriate degree of polymerization and grafting density), it was discovered that it is possible to facilitate the self-assembly of nanoparticles into mechanically robust solid structures with polymer-like elastic and fracture characteristics. The emergence of elastic moduli and toughness characteristics that exceed by, for example, 30%, 50% or more, the respective value of the corresponding unbound polymer is rationalized as the result of chain entanglements between surface-grafted chains of an appropriate architecture. As used herein, the term "architecture" describes the set of parameters that determines the conformational state of surface-grafted chains (that is, grafting density and degree of polymerization of surface-grafted chains, as well as the particle radius). The results set forth herein are interpreted in terms of a semi-quantitative scaling model that provides design criteria for the synthesis of polymer-grafted particle systems that are capable of forming ordered self-assembled structures or bulk fabricated articles.

A number of embodiments of polymer brush systems described in the examples section hereof were based on commercial silica particle samples with appreciable particle size disparity or dispersity. This dispersity introduces more complex trends than would be expected for monodisperse particle systems and also is detrimental, to a limited degree, to the attainable regularity of the resulting particle array structure. Nonetheless, the results discussed below are relevant to a wide range of commercial nanoparticle systems. Particle-surface-to-surface distance is employed herein for scaling and is independent of particle size disparity. Also, polymer graft modification improves or reduces the size disparity of the inorganic core particles in the final polymer brush.

The effect of particle architecture on the order formation in particle array structures was initially evaluated for the particular case of 2D particle assemblies because of limitations of the experimental procedure used to quantify order formation by projection imaging. However, because order formation in both 2D and 3D particle assemblies depends on the balance of attractive and repulsive forces within the polymer brush assemblages, the major trends and conclusions herein will also pertain to the intra-particle organization of bulk particle assemblies.

Figure 8A:
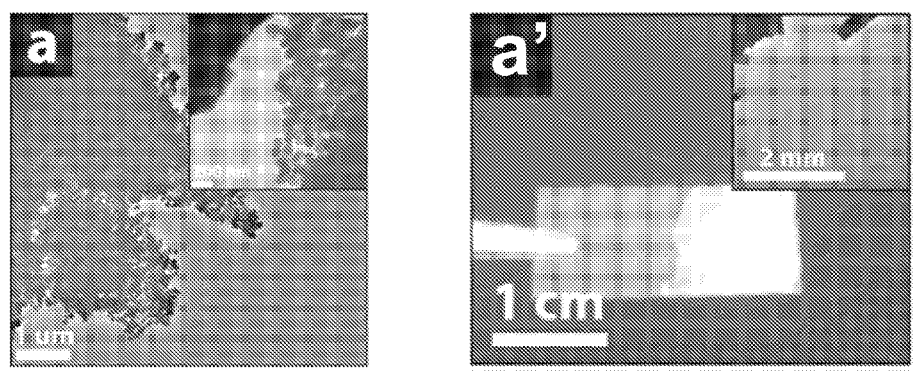
FIG. 8A illustrates a TEM image (a) and an optical image (a') of a free standing self-assembled film of neat (unfunctionalized) silica particles.
Figure 8B:
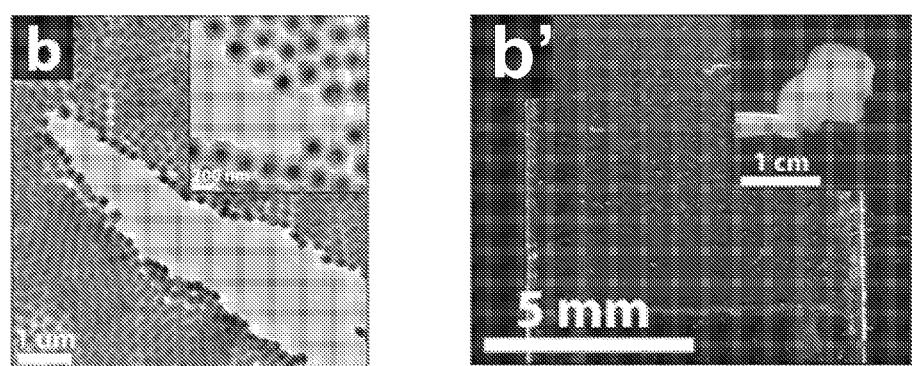
FIG. 8B illustrates a TEM image (b) and an optical image (b') of a free standing self-assembled PS-grafted particles brush film (N=700).
Figure 8C:
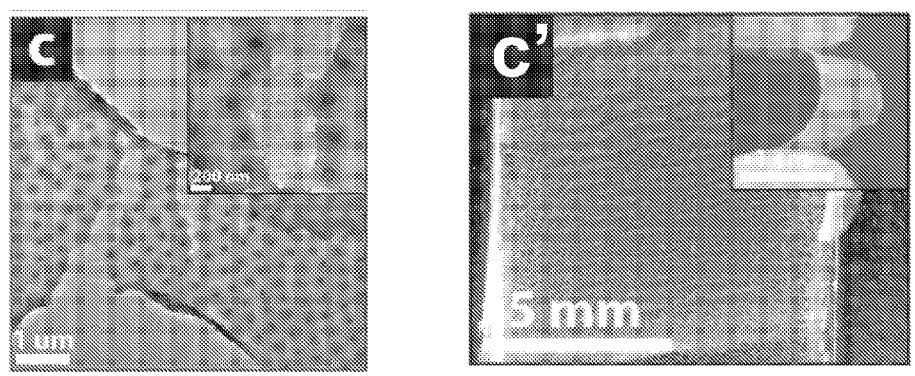
FIG. 8C illustrates a TEM image (c) and an optical image (c') of a free standing self-assembled PS-grafted particles brush film (N=2000).
Figures 9A, 9B:
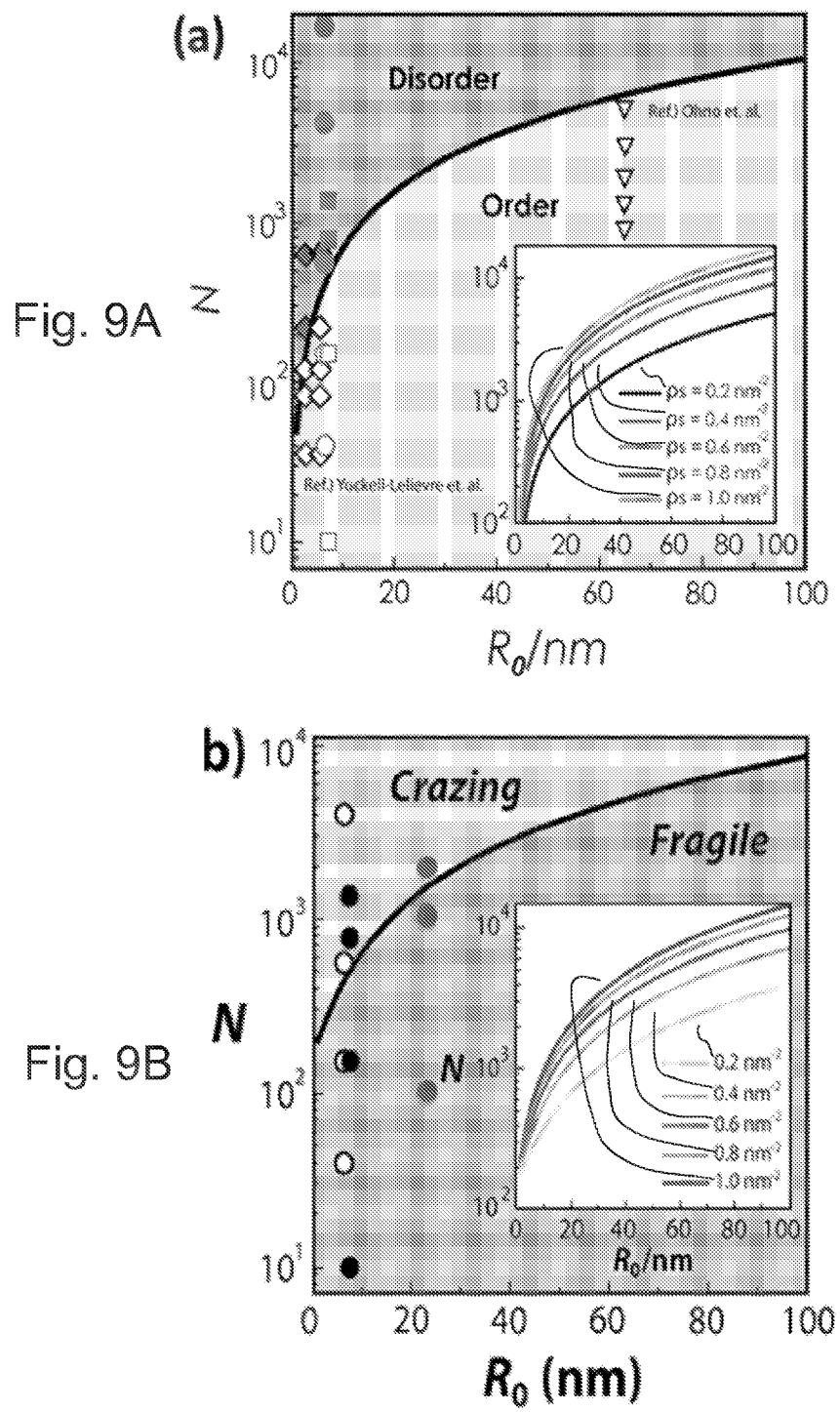
FIG. 9A illustrates a transition from ordered self-assembled polymer coated particles to a more disordered array of self-assembled polymer as a function of particle radius and degree of polymerization, wherein the insets show the theoretical predictions for various grafting densities $\rho_s$.
FIG. 9B illustrates the predicted dependence of the threshold degree of polymerization to facilitate entanglement formation of grafted chains on the particle core size calculated using the equation $N_{min}=2N_c+[a^{-1}(R_c-R_0)]^{1/x}$ and assuming a graft density of 0.5 chains $nm^{-2}$, wherein the inset shows the theoretical prediction for various graft densities and the curves are expected to approximate the transition from fragile particle-like to polymer-like fracture.
Figure 9C:
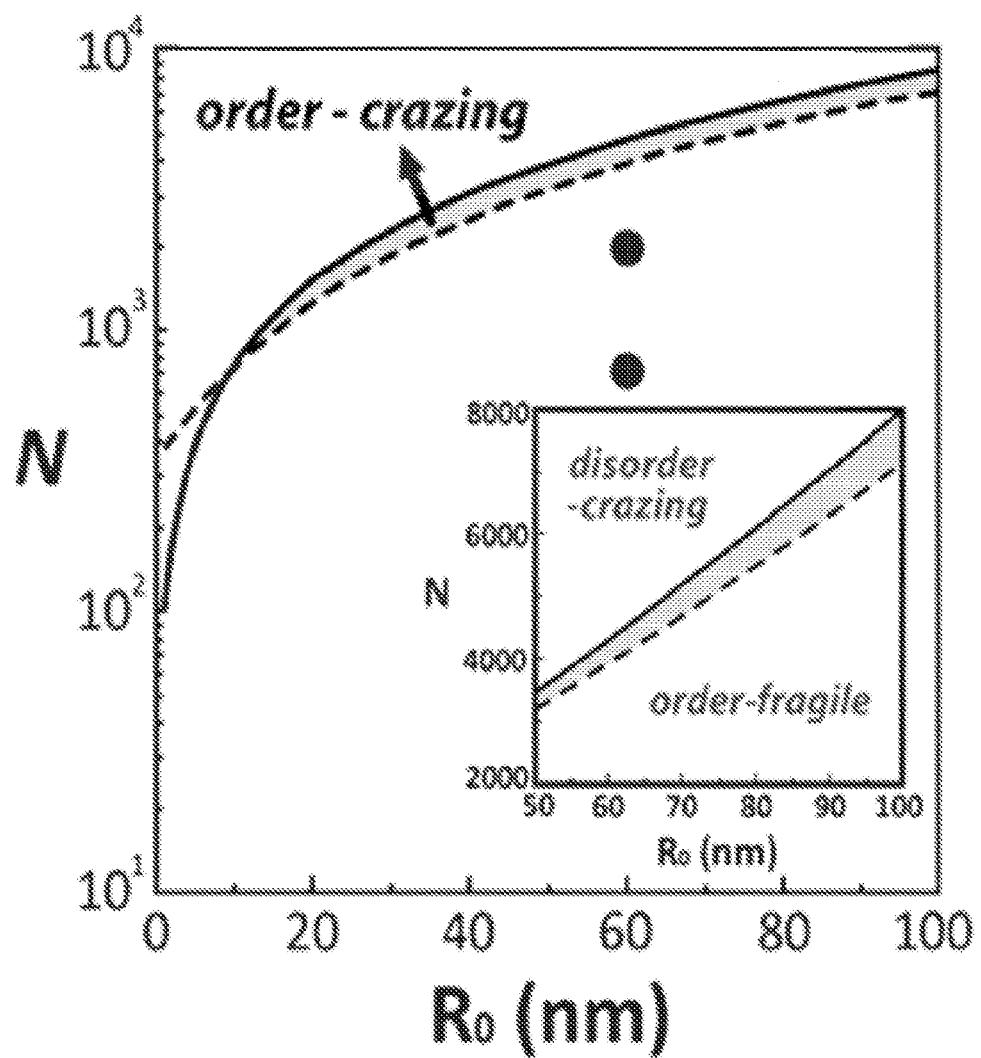
FIG. 9C illustrates a superposition of FIGS. 9A and 9B illustrating a window wherein a film of self-assembled polymer brushes can display both relatively highly ordered particle distribution and polymer-like crazing, wherein the inset is a linear plot over the range of approximately 3500 to 8000 for N and the range of 50 to 100 for $R_0$.

A number of the results and conclusions set forth above are demonstrated in FIGS. 1 to 8. For example, it is demonstrated that nano-hybrid particles or particle brush systems, wherein the solid core particles display a narrow particle size distribution and wherein tethered copolymer chains display a relatively narrow polydispersity (for example, less than 1.5, less than 1.35 or even less than 1.25), self-organize on deposition on a substrate. Moreover, the tethered polymer chains undergo a transition from a concentrated brush regime (with stretched chain conformation) to a semi-dilute polymer brush regime (with relaxed chain conformations), respectively, as the molecular weight of the tethered polymer chains increases beyond a critical calculable value. As the polymer grafted particles or particle brush systems transitioned from CPB to SDPB, properties of films formed from the polymer brush systems transitioned from "fragile-" to "crazing-" type behavior. See, for example, FIG. 9B. The threshold degree of polymerization to facilitate entanglement formation of grafted chains on the particle core was calculated (using equation (2) set forth below) assuming a grafting density ($\rho_s$) of 0.5 chains nm$^{-2}$. The inset of FIG. 9B illustrates the theoretical predictions for various grafting densities, $\rho_s$. As disclosed below the curves are expected to approximately delineate the transition from fragile particle-like fracture to polymer-like fracture. The differently shaded regions above and below the line in FIG. 9B correspond to predicted mechanical response of the material formed from particle brush systems. This transition was closely associated with the "order" to "disorder" transition seen for thin films of 100% self-assembled, polymer-coated solid particles illustrated in FIG. 9A. Surprisingly, when FIGS. 9A and 9B are superimposed on one another as illustrated in FIG. 9C, a relatively narrow window (the shaded area between the solid and dashed lines of FIG. 9C) is identified where a film of self-assembled polymer brushes can display both ordered particle distribution and crazing. An organized environment is formed wherein the formed film provides a quasi-one-component nanocomposite with enhanced physical and retained optical properties.

Figure 1B:
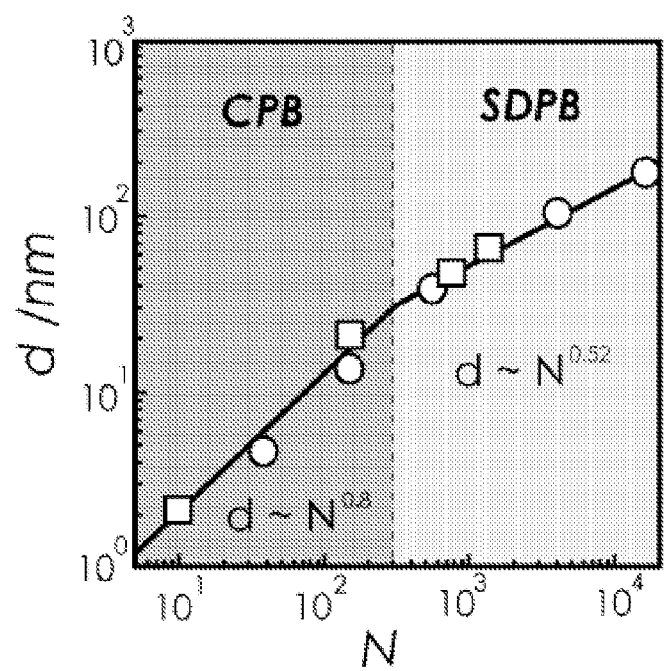
FIG. 1B illustrates scaling of the particle surface-to-surface distance d with degree of polymerization N associated with a CPB/SDPB transition.

When examining the limit of high grafting densities $\rho_s$, a concentrated particle brush (CPB) regime is observed when segmental interactions give rise to extended chain conformations. As the chain density decreases as a result of particle curvature (see FIG. 1A), a transition to the semi-dilute particle brush (SDPB) regime is observed at a radius $r_c$ as the molecular weight of the graft polymer increases. In the SDPB regime, reduced segmental interactions give rise to more relaxed chain conformations. FIG. 1A depicts a schematic illustration of the conformational transitions in a particle brush system with particle core radius $R_0$ grafted with $n=4\pi R_0^2 \rho_s$ polymers, where $\rho_s$ is the grafting density, with a degree of polymerization N along with the expected change of scaling characteristics of the brush thickness h and inter-particle surface-to-surface distance d (wherein d=2 h). FIG. 1B, provides an illustration of the predicted change in scaling of the brush height or particle surface-to-surface distance (using Equation (1) below) with the degree of polymerization associated with the CPB/SDPB transition. In FIG. 1B, the circular symbols represent data from particles with polystyrene (PS) grafts and the square symbols represent data from particles with poly(methyl methacrylate) (PMMA) grafts, which together show the general nature of the dependence of the interparticle surface-to-surface distance on the degree of polymerization and the bulk of the incorporated monomers. The figure clearly shows the transition from CPB to SDPB regime as the molecular weight of the tethered chain increases (that is, $r_c$ increases as $R_0$ increases as a result of the decreased curvature of the surface of the particle). Accordingly larger particles with similar graft densities need longer chains to enter the SDPB regime and exhibit chain entanglement.

Fukuda and coworkers extended the Daoud-Cotton model (originally derived for star-polymers) to particle brush systems dispersed in liquid media. See, J. Physique, 1982, 43, 531-538; Macromolecules, 2000, 33(15), 5602-5607; Macromol. Symposia, 2007, 248, 189-98; Macromolecules, 2007, 40(25), 9143-9150 and *Polym. Chem.* 2010, 1, 1545-1551. A critical distance $r_c$ was postulated to separate the CPB from the SDPB brush regime when the polymer brushes are suspended in a good solvent for the shell polymer. Thus, for a total particle size $R_0+h<r_c$ particle brushes are assumed to be in the CPB regime (with h=N$^x$, and 1>x>3/5) whereas for $R_0+h>r_c$, the SDPB regime, with h≈N$^y$; and y=3/5 in good solvents, is expected. The prediction of relaxed chain conformations in the SDPB regime when the particles are dispersed in a good solvent provides a foundation for our hypothesis that the mechanical properties of particle brush assemblies can be significantly enhanced if the segment length of polymer chains in the SDPB regime is large enough to facilitate interparticle chain entanglements in solids. By adopting the Daoud-Cotton treatment, the critical distance (or brush thickness/height where transition from CPB to SDPB occurs) can be determined as:

$$r_c = R_0(\rho_s^*)^{1/2}(v^*)^{-1} \quad (1)$$

where $\alpha$ is the length of a repeat and $\rho_s^* = \rho_s \alpha^2$ is the reduced grafting density, and $v^* = v/(4\pi)^{1/2}$ is the effective excluded volume parameter, wherein v is the excluded volume parameter. In analogy to the Daoud-Cotton model, the above relationship rests on the assumption of a uniform distance of the chain ends from the particle surface. Thus, depending on the curvature of the core particle the interfacial interactions between the surface-grafted chains in the particle assemblies can be varied, providing valuable insights into the requirements for mechanically robust and compliant particle array structures. Other models to, for example, describe scaling in the CPB and SDPB regions may be used such as proposed by C. M Wijmans and E. B. Zhlina, Macromolecules, 1993, 26, 7214-7224; J. M. H. M Scheutjens and G. J. Fleer, J. Phys. Chem, 1979, 83, 1619-1635; J. M. H. M. Scheutjens and G. J. Fleer, J. Phys Chem, 1980, 93, 7417-7426; and F. A. M. Leermakers and J. M. H. M. Scheutjens, J. Phys. Chem., 1989, 93, 7417-7426. These models approximately capture the structural transitions in particle-brush systems, even in the solid state, and thus provide a basis for the interpretation of physical properties of particle brush assemblies. Although simplifying assumptions underlying the Daoud-Cotton model are expected to render this model less appropriate to predict structural changes in particle brushes, its scaling predictions have shown to approximately capture experimental data of the particle brush height in particle brush solutions.

FIG. 1B is based upon the Gaussian distribution of the normalized areal distribution obtained from the Voronoi tessellation, discussed further below in conjunction with FIGS.

10A and 10B, and the dependence of the order parameter for small particle brush systems on the degree of polymerization for polystyrene grafts (circular symbols) and poly(methyl methacrylate) grafts (square symbols). In the CPB regime, the order parameter increases with the degree of polymerization, whereas the order parameter abruptly begins to decrease beyond the maximum value for each particle brush system in the limit of high degree of polymerization. It was determined that an optimal degree of polymerization to attain a maximum order parameter is very close to the transition between the CPB and SDPB regime, suggesting that the characteristic features in the respective brush regime may be associated with the arrangement of the particle brush systems: 1) extended chain conformation of the densely grafted polymer brushes in the CPB regime and 2) relaxed chain conformation of the segments in the SDPB regime.

Order parameters may be defined in different manners dependent on the material aspect of interest. In the discussion above, the areal distribution of Voronoi cells was used to define the degree of order. Order may also be defined in terms of the regularity of interparticle spacing (for example, particle center-to-center distance). In that regard, for order/mechanical enhancement to occur in a number of embodiments hereof, appropriate polymer graft modification is required as described herein. One consequence of such graft modification is that particles will take regular interparticle spacing during fabrication as a consequence of energy minimization. Regular particle arrays cannot be formed without achieving generally uniform spacing between particles. Using regularity of particle spacing as a "measure" of order provides independency of a particular type of description for 3D periodicity of particle arrays. Thus, in a number of embodiments of compositions hereof, particle center-to-center distance varies by no more than 30%, no more than 20%, no more than 10%, or even less. The variance does not change as thickness of the material increases. The particles pack in a hexagonal arrangement in 2D as well as in 3D (that is, the particles stack to minimize interstitial volume). Methodologies to determine particle spacing and the variance therein include TEM, atomic force microscopy (AFM) and small-angle X-ray scattering (SAXS).

Two different sizes of silica core particles were utilized to demonstrate the effect of particle size on the distinct chain conformations and their influence on the mechanical properties of the particle brush systems of assemblies. The average particle radius of each sample was determined by transmission electron microscopy (TEM) as $R_0$=7.7±2 nm (sample ID: $8SiO_2$-S—N) and $R_0$=29.6±6 nm (sample ID: $30SiO_2$-S—N). Both silica particle samples were obtained from Nissan Chemicals. The characteristics of all particle brush systems studied herein are summarized in Table 1. The brush regime of the respective particle samples was determined by the relationship of the measurable particle surface-to-surface distance d with the corresponding degree of polymerization of surface-grafted chains.

TABLE 1

Characteristics of particle-brush systems with polystyrene (PS) and poly(methyl-methacrylate) (PMMA) grafts.

| Sample-ID | $M_{n, GPC}$ | $M_w/M_n$ | $SiO_2$-wt % by TGA | grafting density (chain/nm$^2$) | particle radius (nm) |
|---|---|---|---|---|---|
| $8SiO_2$-MMA40 | 4,140 | 1.12 | 77.4 | 0.67 | 7.7 |
| $8SiO_2$-MMA150 | 15,400 | 1.14 | 24.6 | 0.63 | 7.7 |
| $8SiO_2$-MMA570 | 57,000 | 1.14 | 8.97 | 0.56 | 7.7 |
| $8SiO_2$-MMA4000 | 400,400 | 1.18 | 1.4 | 0.54 | 7.7 |
| $8SiO_2$-MMA16000 | 1,608,400 | 1.28 | 0.7 | 0.25 | 7.7 |
| $8SiO_2$-S10 | 1,020 | 1.08 | 84.7 | 0.59 | 7.7 |
| $8SiO_2$-S150 | 15,550 | 1.21 | 23.8 | 0.61 | 7.7 |
| $8SiO_2$-S770 | 80,400 | 1.32 | 9.3 | 0.33 | 7.7 |
| $8SiO_2$-S1360 | 141,700 | 1.79 | 5.3 | 0.25 | 7.7 |
| $30SiO_2$-S100 | 10,400 | 1.19 | 71.8 | 0.67 | 29.6 |
| $30SiO_2$-S1000 | 104,000 | 1.42 | 20.3 | 0.53 | 29.6 |
| $30SiO_2$-S1800 | 187,000 | 1.67 | 12.4 | 0.46 | 29.6 |

To elucidate the effect of particle size on the scaling behavior in each regime, the experimental results for the particle system with different particle sizes were combined in a single plot by normalizing degree of polymerization with respect to the critical degree of polymerization ($N_c$), where $N_c$ is determined from the definition of $r_c-R_0=aN_c^x$ (where x is the appropriate scaling parameter in the CPB regime). This methodology enables a rational comparison for the particle brush systems with different particle size (that is, different critical distance $r_c$) through an identical CPB/SDPB transition since the chain conformation of segments relevant to each regime (that is, CPB and SDPB) plays a significant role in determining the micromechanical properties of the particle brush system assemblies. The transition between CPB and SDPB regime for particle system with $R_0 \cong 8$ nm and 30 nm is observed at $N \cong 250$ and 1280 respectively, in good agreement with the prediction; (that is, $N/N_c=1$) based on equation (1) that is indicated by the shaded regimes in FIG. 1B. The figure reveals two scaling regimes $d \sim N^{0.8}$ and $d \sim N^{0.5}$ that are associated with brush architecture in CPB and SDPB regime regardless of the particle size. The scaling within SDPB regime is found to be equal to the expected scaling for polymer melts thus confirming the proposed relaxed conformation of chain segments within the SDPB regime that is a prerequisite for chain entanglement.

Figure 6A:
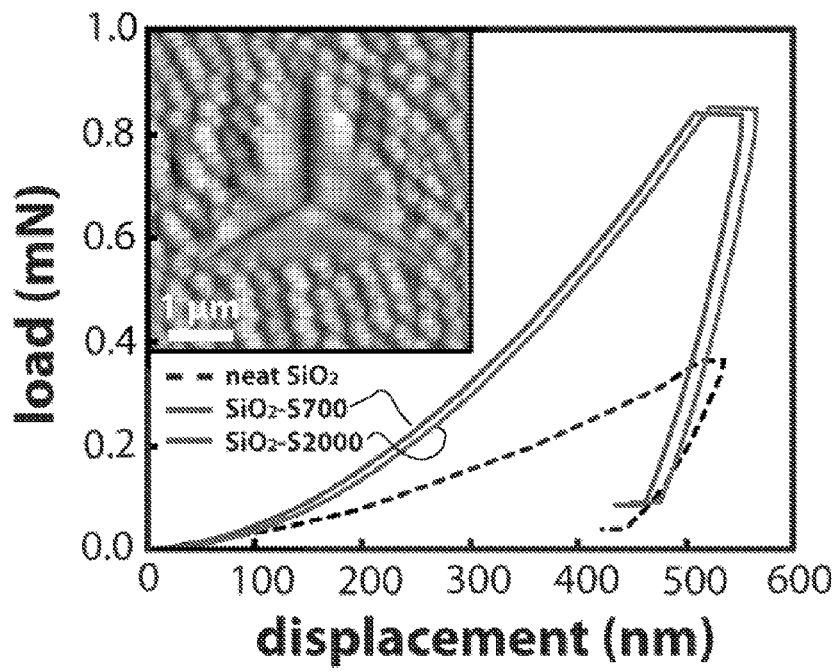
FIG. 6A illustrates indentation curves for neat $SiO_2$ particles, a thick particle brush film (polystryene, N=700), and another thick particle brush film (polystryene, N=2000) subsequent to indentation with a Berkovich indenter, wherein a micrograph of indentation of a thick particle brush film is illustrated in the inset.

Mechanical characteristics of particle brush solids such as elastic modulus, hardness, and fracture toughness were evaluated by the analysis of the load-displacement curves associated with the elastic recovery of a material subsequent to indentation with a Berkovich indenter. Nanoindentation for all particle brush samples was performed (with at least 20 trials for each sample) at a rate of 5 nm/s, up to a maximum load corresponding to 10% relative indentation depth of the film, typical results are shown in FIG. 6A. In particular, the toughness of the particle brush solids $K_{Ic}$ was determined from the analysis of the dimensions of cracks that form along the indenter-tip regions during the indentation process using the following formula: $K_{1c}=1.076x_v(t/l)^{1/2}(E/H)^{2/3}(P_{max}/C^{3/2})$ (wherein c is the total length of the cracks; $P_{max}$ is the maximum load, $X_v$ is an empirical constant=0.015, t is the distance from the center of the indentor to the corner, l is the length of the cracks that emanate from the corners, E is elastic modulus and H is hardness). The residual impression after nanoindentation was observed using atomic force microscopy (AFM) in tapping mode to measure the crack dimensions. Polymer grafting is found to increase fracture toughness by 200%.

Figure 6B:
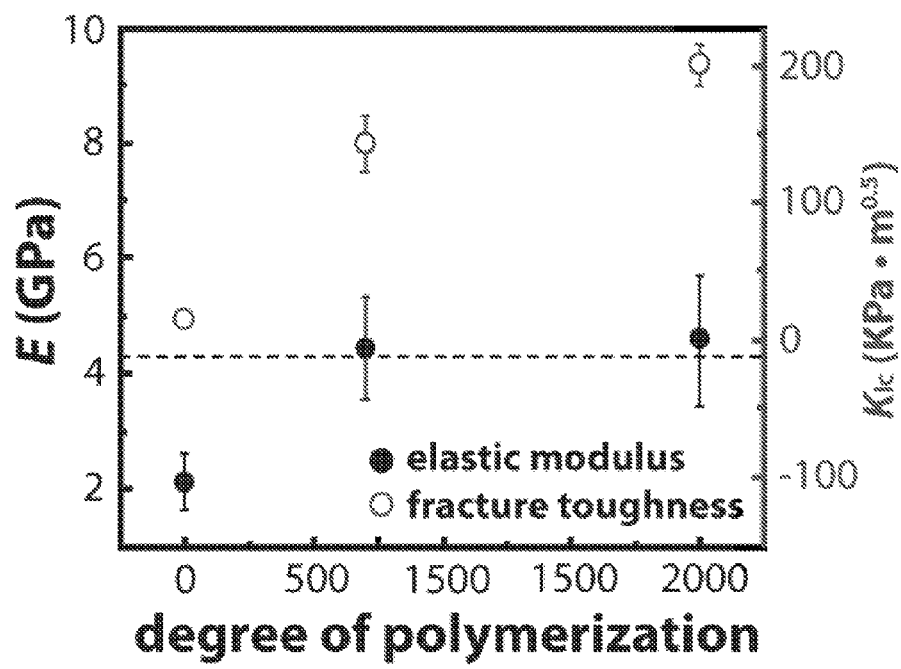
FIG. 6B illustrates elastic moduli and fracture toughness of particles and particle brush systems as a function of degree of polymerization N, wherein the dashed line corresponds to the modulus and toughness of the corresponding bulk homopolymer.
Figure 7A:
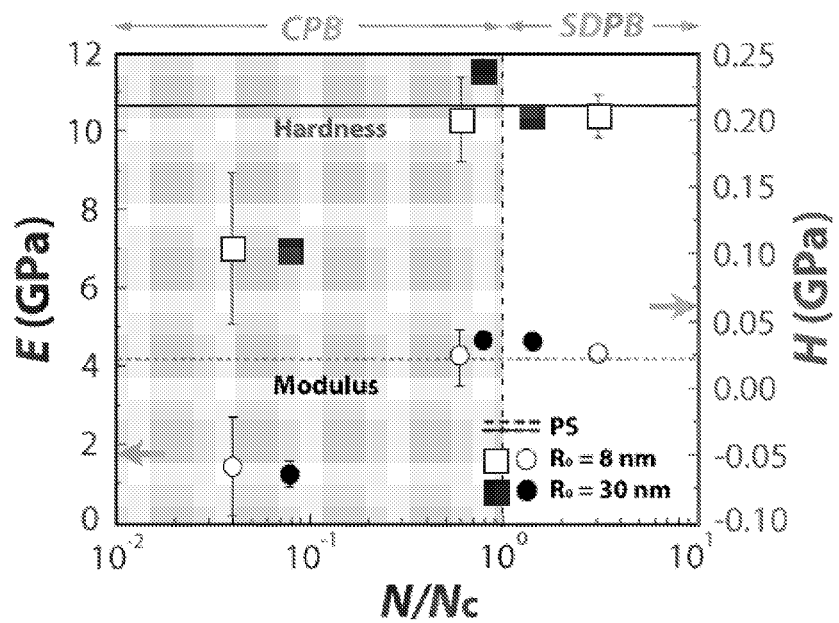
FIG. 7A illustrates elastic moduli E (circular symbols) and hardness H (square symbols) as function of the normalized degree of polymerization of polymer grafts measured by nanoindentation of $SiO_2$/polystyrene particle brush film assemblies (for particle radiuses $R_0 \cong 8$ nm (open symbols) and 30 nm (filled symbols)), wherein the dashed and solid horizontal lines denote the measured E and H, respectively, for linear PS ($M_n$=300,000 g/mol) and arrows indicate the measured E and H for neat (unfunctionalized) silica particle assembly.

Increasing N of surface-grafted chains resulted in significantly increasing stiffness in the CPB regime, which indicates the relevance of the intermolecular interactions associated with the effective molecular volume that depends on the coherence length of induced dipolar moments and thus on the chemical nature of the polymer. FIG. 6B illustrates elastic moduli and fracture toughness of particles and particle brush systems as a function of degree of polymerization N, wherein the dashed line corresponds to the modulus and toughness of the corresponding reference polymer. The independence of the stiffness on the degree of polymerization in SDPB regime further reveals the irrelevance of the chain entanglement on the small strain deformation. FIG. 7A depicts the elastic modulus E (circular symbols) and hardness H (square symbols) as function of the degree of polymerization of polymer grafts measured by nanoindentation of the particle brush film assemblies where the dashed lines denote the measured E and H for linear PS ($M_n$=300,000 g/mol). Arrows indicate the measured E and H for neat (unfunctionalized) silica particle assembly. The error bars represent standard deviations determined by averaging at least 20 indentations per sample. Differently shaded regions (defined by $N/N_c$=1) separated by a vertical dashed line indicate the CPB and SDPB regimes, respectively. The changes in elastic modulus and hardness for particle brush systems with $R_0 \cong 8$ nm (open symbols) and 30 nm (filled symbols) as a function of the normalized degree of polymerization, reveal similar trends for the stiffness in each regime; the continuous increase of the modulus and hardness of the particle film assemblies to the value of the reference linear PS homopolymer (E~4.2 GPa and H~0.2 GPa; represented by horizontal dashed lines) and then leveling off with increasing normalized degree of polymerization. This observation confirms the identical transition of stiffness at the normalized degree of polymerization close to the CPB/SDPB transition despite a considerable difference of particle sizes, indicating the extent of the improvement of stiffness in the particle brush assemblies depends directly upon the ratio of the effective molecular volume of surface-grafted chains to the inorganic particle volume. As a result of the constant ratio of the critical distance to the particle core size (that is., $r_c/R_0$) from equation (1), the normalized degree of polymerization in CPB regime provides an effective means to estimate the relative intermolecular interactions associated with the effective chain length necessary to establish stable and robust particle brush solids.

Figure 7B:
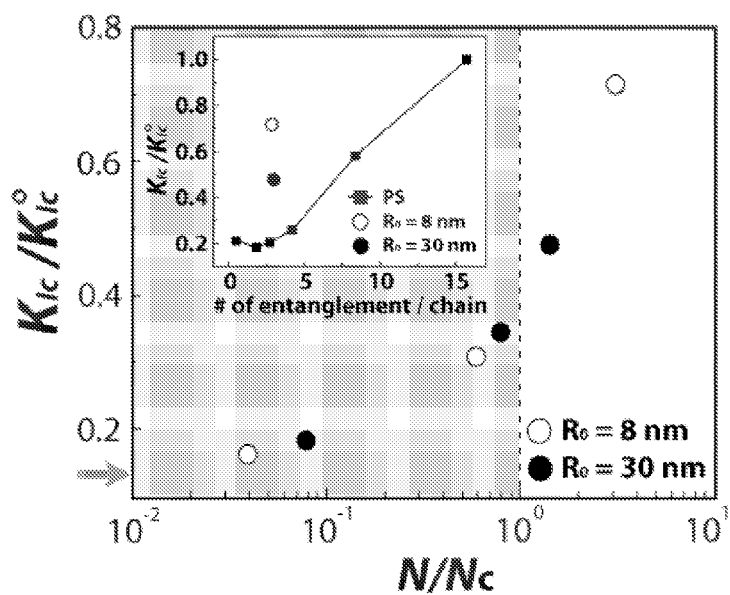
FIG. 7B illustrates the dependence of normalized fracture toughness on the normalized degree of polymerization of polystyrene polymer grafts on $SiO_2$ particles having radii $R_0 \cong 8$ nm and 30 nm, wherein the inset illustrates a plot of the experimental toughness of linear polystyrene PS as a function of entanglement density per chain in comparison to toughness for the particle brush systems in the SDPB regime (that is, $8SiO_2$-S770 and $30SiO_2$-S1800).

FIG. 7B depicts the dependence of normalized fracture toughness $K_{Ic}/K_{Ic}^o$ on the normalized degree of polymerization of polymer grafts in the CPB and SDPB regime where arrow indicates the measured $K_{Ic}$ for neat (unfunctionalized) silica particle assembly. $K_{Ic}^o$ denotes the measured toughness of linear polymer analogues with high molecular weight (that is, PS with $M_n$=300,000 g/mol). The inset in FIG. 7B shows a plot of the experimental toughness of linear PS as a function of entanglement density per chain in comparison to toughness for the particle brush systems in SDPB regime (that is, $8SiO_2$-S770 and $30SiO_2$-S1800). Both polymer graft systems exhibit a pronounced increase of toughness with the normalized degree of polymerization in the SDPB regime beyond the CPB/SDPB transition as a consequence of the existence of chain entanglements that are expected to form in the limit of high N of surface-grafted chains. Based on the CPB/SDPB model, the minimum degree of polymerization to facilitate the chain entanglement was utilized to predict the transition of the mechanical characteristics in the particle brush solids when the segment length in the relaxed SDPB regime exceeds about twice the critical segment length for entanglement formation (that is, $N_{SDPB} \geq 2N_e$, where $N_e$ is the minimum degree of polymerization to facilitate the chain entanglement). The transition to polymer-like mechanical properties predicted in this way was found to be in good agreement with the experimental results for the small particle brush system ($R_0 \cong 8$ nm). A deviation from the mechanical properties based on the entanglement requirement is shown in the inset of FIG. 7B that exhibits the dependence of the normalized toughness on the number of entanglements per chain for the particle brush systems in SDPB regime (that is, $8SiO_2$-S770 and $30SiO_2$-S1800). In spite of almost the same values of entanglements per surface-grafted chain, the small particle brush system ($8SiO_2$-S770) shows higher toughness than the large particle brush system ($30SiO_2$-S1800), indicating the possibility of another characteristic parameter arising from the curvature effect related to the energy dissipation during fracture through microscopic plastic deformation and craze formation.

To elucidate the effect of the particle size on the presence of entanglements and their contribution to energy absorption by means of craze formation, the microstructural changes related to the fracture process were observed for the respective particle brush systems with $R_0 \cong 30$ nm. FIG. 8 reproduces images of electron micrographs of films of neat (unfunctionalized) silica particles and films of PS-grafted particles (particle brush systems) revealing distinct microstructural features involved in the fracture process of the particle brush thin films depending on the particle brush structure and the effect thereof on optical properties. The images on the left of FIGS. 8A through 8C (images a through c)—are TEM images of the free standing films and those on the right of the figures, (images a' through c') are optical images of the same free standing films. Image b of FIG. 8B shows the reflectivity of silica-DP700 particle brush system. Images a'-c' of FIGS. 8A-8C, respectively, indicate optical properties of cast films of neat particles (a'), N=700 (b'), and N=2000 (c') particle brush systems. The neat particle films exhibit white color as a result of diffuse scattering while the particle brush system samples form flexible films with distinct blue color as a result of Bragg reflections.

Figures 10A, 10B:
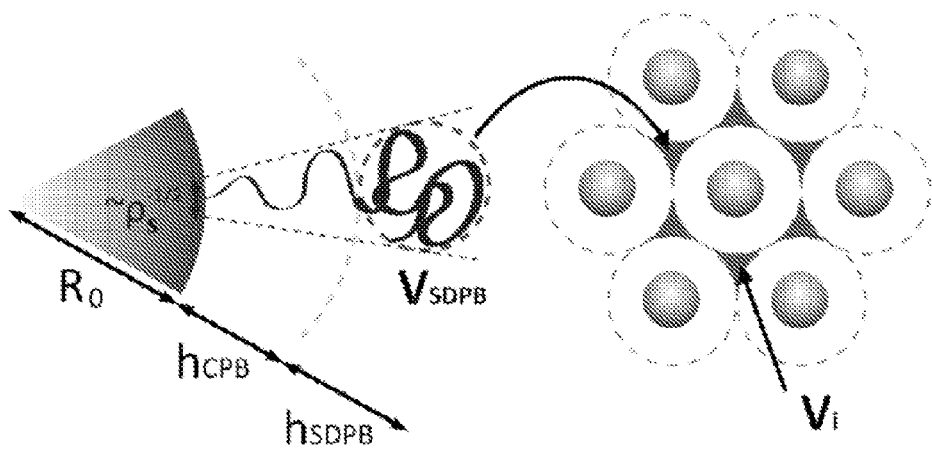
FIG. 10A illustrates schematically a proposed architecture of two-phase particle brushes.
FIG. 10B illustrates the close-packed hexagonal order formed by the dense brush inner region and associated interstitial volume, $V_i$.
Figure 10C:
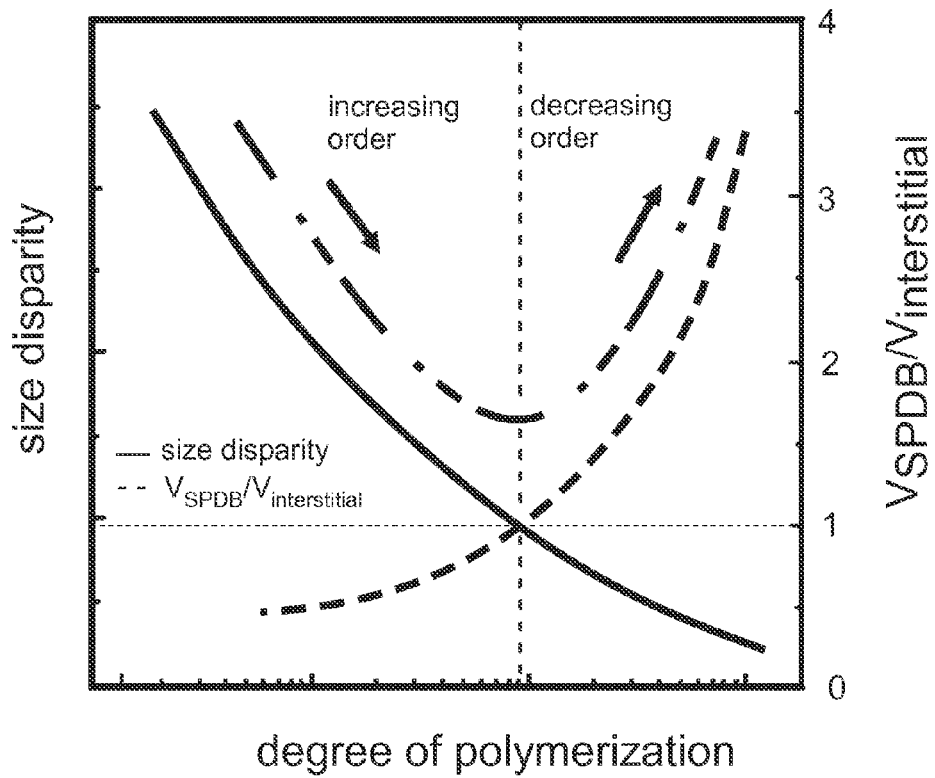
FIG. 10C illustrates schematically the dependence of the order parameter on degree of polymerization and size dispersity, wherein the order parameter is defined as (1−FWHM) where FWHM corresponds to the full width at half maximum of the areal distribution of Voronoi cell elements that can be constructed from electron microscopy images of particle monolayer structures.

The dependence of the entanglement density on the particle size and the resulting mechanical characteristics may be understood by considering the structural constraints of the chain conformation arising from packing of surface-grafted chains into the interstitial sites in the close-packed structure of particle brush assemblies. For example, one may consider the packing situation of the particle brush systems in a 2D close-packed array of sample $30SiO_2$-S1800 and the corresponding Voronoi tessellation shown in FIGS. 10A and 10B. FIG. 10A shows the proposed architecture of two-phase particle brushes depicting the stretched-to-coil transition of chain conformations. FIG. 10B illustrates the close-packed hexagonal order formed by the dense brush region (that is, $R_0+h_{CPB}$) where shaded dark areas show interstitial regions that must be filled by coiled chain segments in the SDPB regime. FIG. 10C provides a schematic presentation of the expected trend of order parameter depending on degree of polymerization. The analysis followed the procedure of earlier work by Montoro and Abascal who demonstrated that the width of the distribution of Voronoi cell areas provides a quantitative descriptor of the structural regularity of liquids and solids; *J. Phys. Chem.* 1993, 97, 4211-4215. The order parameter is defined as (1−FWHM) where FWHM corresponds to the full width at half maximum of the areal distribution of Voronoi cell elements that can be constructed from electron microscope images of particle monolayer structures. The formation of interstices in the particle assemblies implies additional unfavorable surface interactions between polystyrene and air. The formation of interstices, such that polymer chains are expected to stretch and fill the corner regions of the Voronoi cells, involves a free energy penalty of two different origins: surface tension and elasticity. The associated free-energy balance is approximately given by $\Delta F \sim nk_B T[(r_2-r_1)/r_1]^2 - A\gamma_{PS/air}$, where n is the number of chains involved in filling the interstitial region, $k_B$ is the Boltzmann constant, and A and $\gamma_{PS/air}$ are the surface area and the interfacial tension of polystyrene/air, respectively. Further, $r_1$ is the radius of the CPB regime, and $r_2$ is the radius to the center of the interstitial void. Since the interfacial energy associated with the formation of one interstitial site is greater than the elastic free energy for stretching of (Gaussian) polymer chains (i.e., $F_{el} \sim k_B T \ll F_{PS/air} \sim 10^3 k_B T$), chain stretching is strongly favored over the formation of "free" interstitials. The interstitial volume ($V_{int}$) scales as the cube of the particle core size (i.e., $V_{int} \sim R_0^3$), leading to more "free" space for larger particle systems that imposes restrictions on the local segmental conformation (that is, the associated chain conformational distortions required to accommodate the void-free particle brush array). Thus, for larger particle brush systems the increasing restriction on the chain conformation causes a depletion of entanglements in the interstices, compared to that of bulk polymer melts with randomly coiled conformations, leading to the reduced resistance of the system against plastic deformations (that is, toughness).

As the volume of relaxed chain segments exceeds the available void space the close packed regular structure can no longer be maintained and a decrease of the order parameter is expected. Following the above argument the critical degree of polymerization that results in a decrease of structural regularity of particle arrays can thus be estimated by the condition that the volume fraction of segments in the SDPB regime ($\Phi_{SDPB}$) exceeds the available void space ($\phi_{void}$), that is:

$$\phi_{SDPB} = C4\pi R_0^2 \sigma N_{SDPB} a^3 > \phi_{void} = 0.26 \quad (2)$$

where a close packed arrangement of monodisperse particles has been assumed and C is a constant, of the order unity, that accounts for the number of particles per unit cell. Evaluation of this condition as a function of particle core size, grafting density and degree of polymerization of surface-grafted chains allows the construction of a "structure map" for the expected order formation characteristics of particle brush systems as illustrated in FIG. 9C.

A non-limiting interpretation of this phenomenon would indicate that control over the dispersity of the tethered polymer chains can be designed to provide a fraction of longer polymer chains that can fill the interstitial region without imposing conformational restrictions on the polymer brush. This can be accomplished by selecting polymerization conditions that generate attached polymer chains with broader $M_w/M_n$ or creation of tethered polymer chains with a bimodal $M_n$. Thus, for larger particle brush systems the increasing polydispersity of the tethered chains reduces the restriction on the chain conformation thereby retaining the expected number of chain entanglements at the periphery of the polymer brush molecules in the interstices compared to that of bulk polymer melts with randomly coiled conformations, leading to increased resistance of the system against plastic deformations (i.e., increased toughness).

An example of a convenient method to form bimodal tethered chains would be to prepare a bimodal grafted particle by "clicking" to a fraction of functional polymer shell grafted chains prepared by any controlled/living polymerization process forming tele-functional "grafted from" chains, not just chains formed by the first controlled grafting from polymerization reaction exemplified herein by ATRP. As known in the art, a grafting from processes requires that a reactive group be present at terminus of the growing polymer chain. This reactive group may, for example, be converted to another group that can interact via click chemistry. Click chemistry is a chemical philosophy introduced by K. Barry Sharpless (*Angewandte Chemie International Edition* 40 (11): 2004-2021 (2001)), and describes chemistry tailored to generate substances quickly and reliably by joining small units together. Such chemistry is inspired by the fact that nature also generates substances by joining small modular units. The Huisgen 1,3-dipolar cycloaddition, in particular the Cu(I)-catalyzed stepwise variant, is often referred to simply as the "click reaction" and is compatible with catalyst complexes used for ATRP.

Another non-limiting interpretation would be that at the "order" to "disorder" transition seen for thin films of 100% self-assembled polymer coated solid particles, order is retained as a result of the chain extension to fill the interstitial voids forcing increased interpenetration of the peripheral chains of contacting polymer brushes thereby retaining organized environment. A film formed with such order provides properties associated with a quasi-one component nanocomposites with enhanced physical and optical properties. It is only when the molecular weight of the tethered chains are increased so that the chains can fill the interstices by normal relaxed chain conformations that disorder starts to increase. See, FIG. 10C. The targeted order-crazing environment is shown by the curved transition in the increasing order-decreasing order curve compared to the sharp transition expected for self-organized polymer brushes indicated by decrease in size dispersity vs. increasing value for $V_{SDPB}/V_{inst}$. The transition in the variable chain conformation is not a sharp transition predicted in scaling models described herein, but is a more gradual transition (which, without limitation to any mechanism, may be explained by the ability of the polymer chains to attain differing conformations to reduce energy in the material). Nonetheless, the scaling models described herein adequately capture experimental data of particle brush systems.

Examples of specific commercial fields that will benefit from the devices, systems, methods and compositions hereof are the fields of photonic crystals and quantum dots. In that regard, strategic choices of particle system and polymer graft modification are provided herein to facilitate the self-assembly of plastic colloidal crystal structures that facilitate the fabrication of reflective coatings with reflectivities exceeding, for example, 0.3. As used herein, the term "colloidal crystal" refers to an ordered array of colloid particles, analogous to a standard crystal whose repeating subunits are atoms or molecules. Such a value of reflectivity cannot be achieved by alternative, non-structure related means (such as white light scattering of disordered particle assemblies), with mechanical robustness and polymer-like processability. Numerous opportunities are provided for the design of bulk particle brush systems for applications such as photonic coatings, quantum dot array structures, paints or inks.

Figure 2:
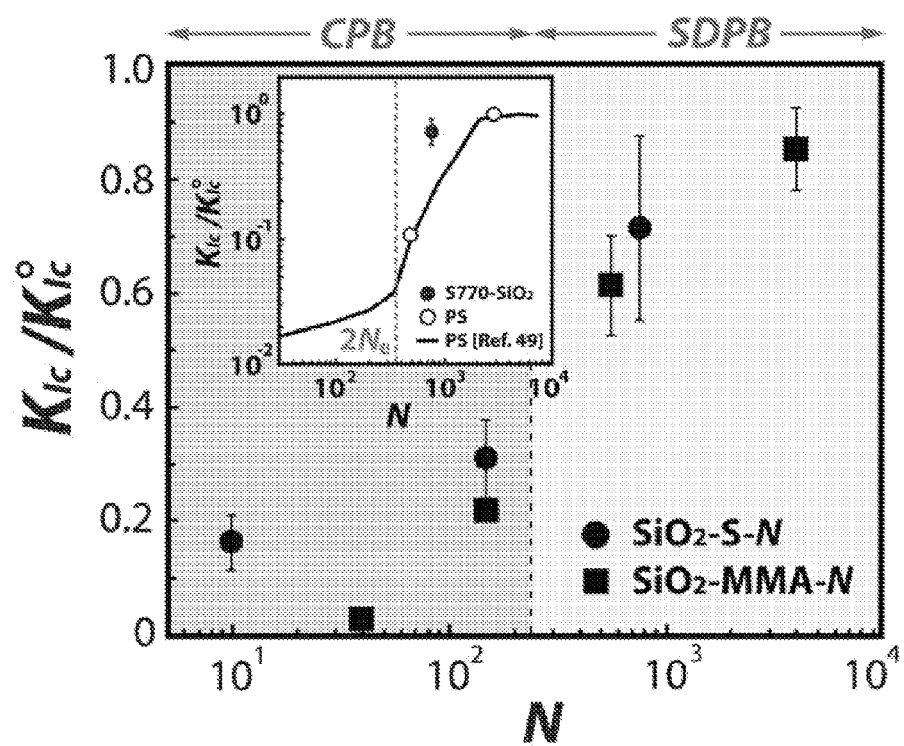
FIG. 2 illustrates the dependence of normalized fracture toughness on the degree of polymerization, wherein the inset illustrates a plot of the experimental toughness of $SiO_2$-S770 (filled circles) and linear polystyrene (PS) with $M_{n,GPC}$=52,000 and 300,000 (open circles) in comparison to toughness values for PS reported in the literature.

FIG. 2 compares the measured toughness of polystyrene grafted particle brushes with literature values for polystyrene homopolymers (data adopted from R. P. Wool, B.-L. Yuan and O. J. McGarel, *Polym. Eng. Sci.*, 1989, 29, 1340-1367.) and shows the dependence of normalized fracture toughness $K_{Ic}/K_{Ic}^o$ on the degree of polymerization of polymer grafts in the CPB and SDPB regimes. $K_{Ic}^o$ denotes the measured toughness of linear polymer analogues with high molecular weight (i.e., PS with $M_{n,GPC}$=300 000 and PMMA with $M_{n,GPC}$=996 000). The inset in FIG. 2 shows a plot of the experimental toughness of $SiO_2$-S770 (filled circles) and linear PS with $M_{n,GPC}$=52,000 and 300,000 (open circles) in comparison to toughness values for PS reported in the literature. To allow for equal scale, the literature data were normalized with respect to the limiting value at high molecular weights. While both polystyrene homopolymer systems that were evaluated in the present study confirm the reported trend of $K_{Ic}(M)$, the toughness of $SiO_2$-S770 is found to exceed the expected toughness by almost one order of magnitude. Without limitation, this observation may, for example, be rationalized in a number of embodiments hereof by contributing the increased toughness of particle brush solids to a consequence of the connectivity of grafted chains with the particle center that imposes topological constraints on the deformation of the entanglement network. Since each particle core is connected to $n=4\pi R_0^2$ $10^3$ polymer grafts the effective number of entanglements per particle brush should be of the order of a thousand fold increase when compared to one individual grafted chain. Similar to the behavior observed for high molecular weight homopolymers, the increase of connectivity between the constituents should result in the stabilization of crazes that increase the resistance of the system to crack propagation.

FIG. 3 provides a comparison of the structure and mechanical properties of particle-brush-based, quasi-one-component nanocomposites with those of a binary particle/homopolymer composite with similar overall composition. FIG. 3A illustrates a TEM image of the "quasi one-component" nanocomposite composed of the particle brush system $SiO_2$-S770 revealing short-ranged ordered arrangement. FIG. 3B illustrates a TEM image of binary nanocomposites (composed of a blend of the particle brush system $SiO_2$-S150 and linear PS with $M_{n,GPC}$=52 000), exhibiting randomized particle dispersion. The scale bar in the figures is 100 nm. FIG. 3C illustrates values obtained for the toughness (filled symbols) and elastic modulus (open symbols) of quasi-one-component (circles) and binary (stars) nanocomposites with near identical filling fraction of inorganic component (10% w/v silica). Significantly, an increased toughness is observed in the case of the particle-brush nanocomposite. These observations reveal that the molecular connectivity between the particle and polymer components in particle brush system; a "quasi one-component" nanocomposite composed of the particle brush system $SiO_2$-S770 facilitates the formation of short-ranged ordered structures with regular particle spacing (FIG. 3A) whereas a random particle dispersion, composed of a blend of the particle brush system $SiO_2$-S150 and linear PS with $M_{n,GPC}$=52,000 is observed in the case of the binary nanocomposite system (FIG. 3B). The increased control of the microstructure of the composite is accompanied by a pronounced increase in fracture toughness, at about equal elastic modulus, of the quasi-one-component nanocomposite that may, without limitation, be explained by the increased number of entanglements per constituent polymer brush to significantly increase the toughness in the case of bulk particle-brush nanocomposites. See, FIG. 3C. Continued work on self-organizing hybrid particles has shown that this unexpected enhancement of film toughness where narrow dispersity particles. Size dispersity was measured in terms of the variance of particle radii in a representative sample of the particle system (as, for example, measured by statistical analysis of TEM images). The following definition for effective particle brush size dispersity (SD) was used herein: $SD=\sigma/(2R_0+d)$, where $\sigma$ is the standard deviation of the particle core diameter and d the particle surface-to-surface distance (or twice the brush height) that is determined from electron micrographs of particle brush monolayers. In a number of embodiment hereof, SD varies between approximately 1.01 and 2.0. In a number of embodiments, SD is no more than 1.5, no more than 1.35, no more than 1.25 or even less. Providing narrow dispersity polymer chains tethered to the particles provides an unexpected set of properties as the composite material transitions from "hard sphere like" to "polymer like" mechanical characteristics. While narrow dispersity in particle size as well as narrow PDI is the simplest manner to achieve a clear calculable CPB to SDPB transition, some degree of dispersity can be tolerated in both particle size and PDI.

In contrast to conclusions in earlier studies, we have discovered that unexpected property enhancement occurs at the relatively narrow transitional environment wherein the well-ordered arrangement seen for the fragile CPB regime additionally exhibits the increased toughness of the SDPB regime, where crazing occurs. The structural transition from "ordered" to "disordered" and the mechanical transition from "hard-sphere-like" to "polymer-like" of particle solids depends on the grafting density and the degree of polymerization of grafted chains, thereby facilitating flexible particle array structures. Specifically, a pronounced improvement of the toughness of particle solids was observed when the degree of polymerization of grafted chains exceeded a threshold value as a consequence of the existence of entanglements between surface-grafted chains that give rise to energy dissipation during fracture by supporting microscopic plastic deformation and craze formation. This transition in properties is observed as the well-defined, self-organized polymer brush particle transitions from hard sphere-like to polymer-like properties and can result in the formation of readily processable materials with, for example, "photonic crystal" behavior.

The distance between the ordered particles in, for example, a film formed from particle brush systems depends on the grafting density for same sized particles. Thus, for particles of the same size, the photonic response and physical properties of the final composite would depend on graft density and could be tuned by increasing or decreasing the graft density and corresponding molecular weight of the graft to attain appropriate distribution of inorganic particles to self-organize and provide a fragile/crazing, order/disorder, transition enabling an ordered/tough material. In a number of embodiments hereof, grafting density determines the chain conformation, which determines the scaling relationship between degree of polymerization and particle distance, and thus, for a given particle system, the optical response.

As used herein, the term "processable", which may have been expected only for particle brush systems in SDPB regime, is characterized with the following: 1) can be processed by polymer-like processing methods, and 2) can be processed by using physico-chemical properties of polymer grafts. For example, we were able to "pattern" particles that were grafted with distinct polymer grafts by using the property of polymer blends to induce phase separation. Distinct particles, with distinct grafts, therefore self-separate into domain structures which would be of interest in the context of fabricating "domain structures" of particles, such as quantum dots, for which currently complex printing techniques are being used by simple deposition of the composite structure on a solid surface. The tendency of different polymers to phase separate may thus be used as a means to fabricate particle microstructures. Particles (perhaps with different core composition) with different polymer grafts are admixed and deposited on a substrate. The phase separation process during the drying (if we take solution casting as one processing example) will lead to the autonomous separation of the distinct particle species in domains that are enriched with particles of the same graft composition. Such domain separation may, for example, simplify printing processes using multi-particulate systems. Phase separation may, for example, occur in the case of block copolymers, where the final morphology is partially based on the fraction of each phase (for example, lamellar cylindrical or gyroidal structures may be formed) which may be beneficial in forming ordered quantum dot systems wherein one segment of the block copolymer is selected to interact with the selected quantum dot material.

We were also able to print surface structures with features, of a size in the micrometer range, by heating the particle brush film and subsequently embossing a structure within the film. Molded cylindrical objects composed of polymer brush structure could be stretched at temperature 60-70° C. below the Tg of the homopolymer matrix further demonstrating the unique flexibility and toughness of the ordered particle brushes.

The term "photonic crystal" as used herein relates to a heterogeneous material in which the modulation of the material's refractive index, or alternatively the dielectric constant, gives rise to the formation of stop-bands—that is, frequency ranges in which the propagation of light, dependent on its polarization, through the medium is limited. Because of their ability to "control the flow of light", photonic crystals are being considered an enabling technology to facilitate a wide range of applications from optical coatings and sensor applications to all-optical computing. Because the engineering of photonic effects in the visible wavelength region necessitates the preparation of periodic structures with characteristic dimensions of the order of 100 nm, a length scale range in which lithographic techniques are not economically viable for most application scenarios, self-assembly processes have attracted particular attention as a facile route towards photonic crystal materials. In particular the assembly of spherical colloids into periodic array structures, referred to herein as "colloidal crystals", has attracted interest because of the ease of preparation by controlled solvent evaporation from particle suspensions. Colloidal crystals have shown to hold potential in areas ranging from "effect coatings" for next-generation paints to colorimetric sensors in a variety of pharmaceutical applications.

Figures 4A, 4B, 4C:
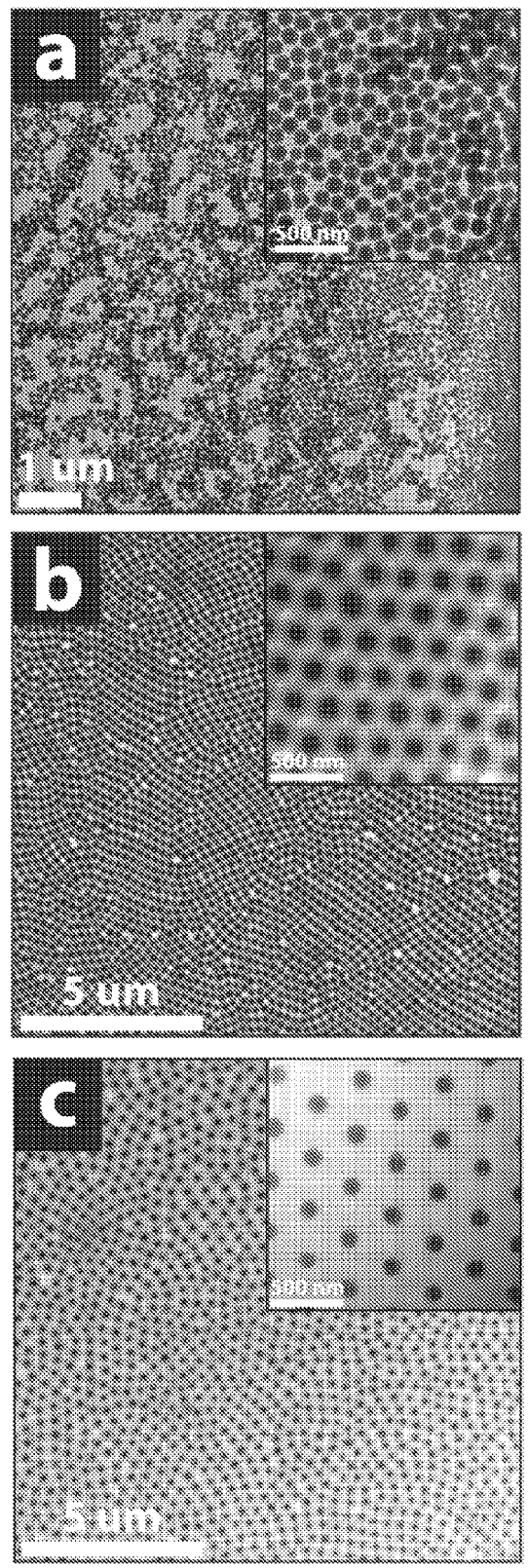
FIG. 4A illustrates a scanning electron microscopy (SEM) image of a monolayer of neat silica particles deposited on a surface.
FIG. 4B illustrates an SEM image of a monolayer structure for silica/polystryene particle brushes with a degree of polymerization of surface grafted chains of 700.
FIG. 4C illustrates an SEM image of monolayer structures for silica/polystryene particle brushes with a degree of polymerization of surface grafted chains of 2000.
Figure 5A:
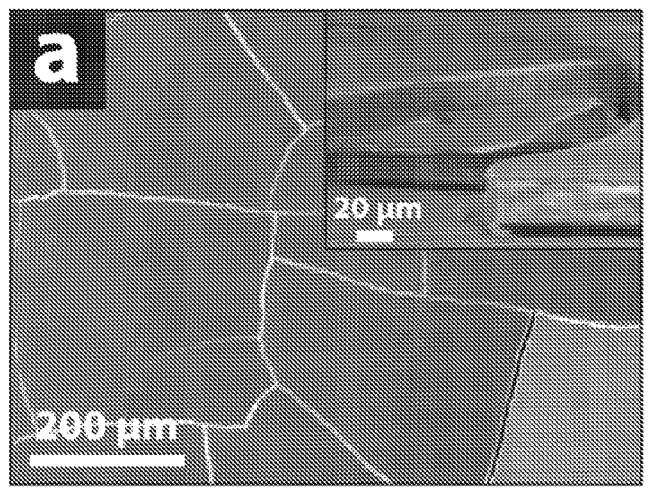
FIG. 5A illustrates an SEM image of brittle fracture in neat silica particle film.
Figure 5B:
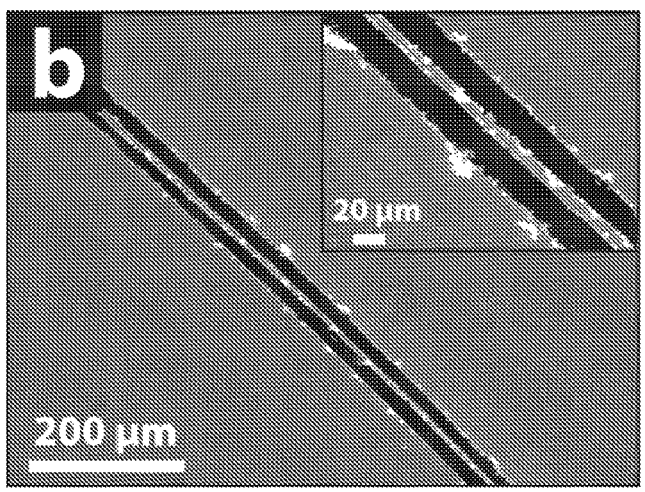
FIG. 5B illustrates an SEM image of a thick silica/polystryene particle brush film (N=700) depicting crack resistance.
Figure 5C:
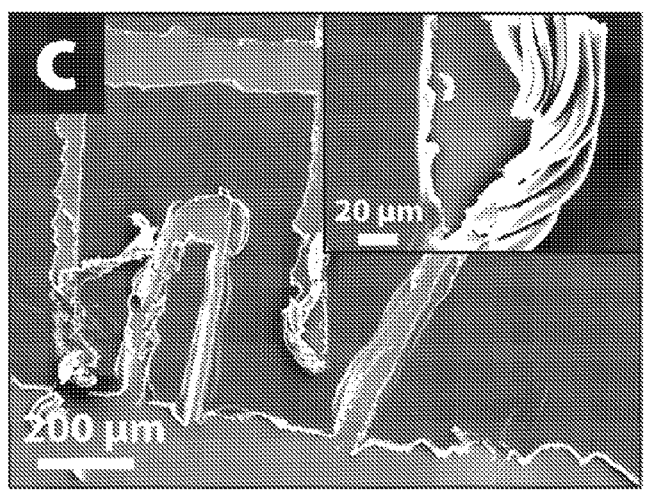
FIG. 5C illustrates an SEM image of a thick silica/polystryene particle brush film (N=2000) depicting crack resistance.

However, while the principal usability of self-assembled colloidal crystal materials has been demonstrated, a major technological barrier arises because of the fragile nature of colloidal assemblies that implies extensive post-fabrication processing such as polymer infiltration, as well as preventing the application of established and scalable fabrication techniques such as printing, dipping or roll-to-roll processing. The fragile nature of colloidal assemblies is fundamentally rooted in the surface chemistries that are implied by current particle synthesis techniques that result in short-ranged, van der Waals or electrostatic, particle interactions. FIGS. 4A through 4C illustrate scanning electron micrographs of spin-cast particle monolayers revealing mechanical properties and scratch properties of neat silica particles and thick particle brush films depicting crack formation and brittle fracture in neat particle films (FIG. 4A). FIG. 4A shows the distribution of neat silica particles deposited on a surface, while FIGS. 4B and 4C show films of monolayer structures for particle brushes with degree of polymerization of surface grafted chains of N=700 and N=2000, respectively. The images confirm an increased degree of order in particle brush assemblies. The result of this organization is shown in FIGS. 5A through 5C, which show scanning electron micrographs revealing mechanical properties and scratch properties of neat particle films and thick particle brush films. FIG. 5A depicts crack formation and brittle fracture in neat particle films. FIGS. 5B and 5C illustrate uniform film structure and crack resistance in particle brush films with N=700 and N=2000, respectively, demonstrating the transition from a brittle material to a uniform film that provides crack resistance for films prepared from well-defined nanocomposites structures.

As commercial samples of silica particles were employed in a number of studies, the non-uniform nature of the silica cores of the polymer brushes can be seen in FIG. 3A. In FIG. 4C, silica cores prepared using the Stober procedure, provide more uniformity. Nevertheless, both figures show uniform dispersions of the particles in the films. While the core silica particles are not uniform in size in the example of FIG. 3A, they still provide polymer brushes that confirm the scalability of the CPB/SDPB transition because particle-surface-to-surface distance was used in scaling, which is less dependent on particle size disparity as polymer graft modification narrows particle size dispersity. This is shown schematically in FIG. 10C.

In several embodiments hereof, a process for formation of flexible colloidal films includes growing or tethering polymer brushes on inorganic colloids wherein the tethered polymer chains exhibit a chain length that exceeds a critical molecular weight (that is dependent on inorganic particle size and grafting density) so that the tethered chains can interpenetrate polymer chains associated with neighboring polymer brushes and provide flexibility to the bulk structure comprising the polymer brushes while retaining order of a colloidal crystal. A crystal in this context may, for example, be a particular arrangement of particle brush colloids with a degree of order sufficient to allow for the fabrication of reflective films with reflectivities exceeding 0.3.

Other fields that face similar fabrication and environmental stability problems include solid-state lighting (SSL) technologies, which are expected to revolutionize energy efficient lighting and fabrication of quantum dots. Quantum dot (QD) materials are selected from elements of Group II-VI, such as CdSe, CdS, CdTe, ZnSe, ZnO, ZnS, ZnTe, HgS, HgSe, HgTe and alloys thereof such as CdZnSe; Group III-V, such as InAs, InP, GaAs, GaP, InN, GaN, InSb, GaSb, AlP, AlAs, AlSb and alloys such as InAsP, CdSeTe, ZnCdSe, InGaAs; Group IV-VI, such as PbSe, PbTe and PbS and alloys thereof; Group III-VI, such as InSe, InTe, InS, GaSe and alloys such as InGaSe, InSeS; Group IV semiconductors, such as Si and Ge alloys thereof, and combinations thereof in composite structures. Further suitable semiconductor materials include any type of semiconductor, including group II-VI, group III-V, group IV-VI and group IV semiconductors. Suitable semiconductor materials include, but are not limited to, Si, Ge, Sn, Se, Te, B, C (including diamond), P, BN, BP, BAs, AlN, AlP, AlAs, AlS, AlSb, BaS, BaSe, BaTe, CaS, CaSe, CaTe, GaN, GaP, GaAs, GaSb, InN, InP, InAs, InSb, AlN, AlP, AlAs, AlSb, GaN, GaP, GaAs, GaSb, ZnO, ZnS, ZnSe, ZnTe, CdS, CdSe, CdTe, HgS, HgSe, HgTe, BeS, BeSe, BeTe, MgS, MgSe, GeS, GeSe, GeTe, SnS, SnSe, SnTe, PbO, PbS, PbSe, PbTe, CuF, CuCI, CuBr, CuI, $Si_3N_4$, $Ge_3N_4$, $Al_2O_3$, $(Al, Ga, In)_2 (S, Se, Te)_3$, and $Al_2CO$ are of interest as a basis for next generation SSL technologies, because the efficiency of red-green-blue (RGB) optical modules based on "blends" of QDs with appropriately engineered band structures significantly surpasses current rare-earth phosphor based white LEDs.

One particular technology area that that can be addressed by the self-assembly of well-defined core-shell nanoparticles are QD-based full color luminescent panels that are currently being pursued as candidates for next generation active display and lighting technologies. To facilitate this type of application QDs are being dispersed in cross-linkable solvents and multiple monochromatic zones are subsequently fabricated by screen printing on panel substrates. The organization of QDs into monochromatic zones is important to reduce inter-particle absorption processes, prior to setting of the matrix. Established manufacturing processes apply four-color screen or inkjet printing to fabricate monochromatic zones of QDs. However, the sequential nature of the multistep pattern formation process that is characteristic of zone printing, as well as the high costs associated with both installation and maintenance of the required infrastructure, present a formidable challenge for the successful commercialization of QD-based active display and lighting technologies.

A secondary challenge associated with current particle deposition techniques is the lack of control of the dispersion morphology of QD-polymer composites. See, Macromolecules 1997, 8433-9 and 417-26. In that regard, particle proximity, below a threshold distance that depends on both the material system and the type of interaction, gives rise to shifts in the absorption and emission wavelengths (Stokes shift) as well as optical loss processes that have been associated with the quenching of excited electronic states and optical re-absorption. J. Phys. Chem C. 2110 5751-9. Thus precise control of the QD-QD distance within the monochromatic zones, and in particular avoidance of particle aggregation, is a critical prerequisite to maximize photon output characteristics of QD/polymer-based luminescent panels.

The devices, systems, methods and compositions hereof also facilitate transformative advances in the high-throughput fabrication of QD-based luminescent panels by harnessing the autonomous organization of polymer-modified QDs into monochromatic domain structures. Surface-initiated atom-transfer radical polymerization (SI-ATRP) may, for example, provide efficient means for the functionalization of nanoparticles with polymers of precisely controlled architecture, i.e. molecular weight and density, of surface-grafted chains. Macromolecules 2009, 42, 2721; J. Am. Chem. Soc. 2010, 132, 12537-12539; Adv. Mater. 2007, 19, 4486.

This type of particle modification process is highly scalable as is demonstrated by several successful commercial applications of ATRP-based products, for example, in the area of PROPAC® IMAC-10 analytical HPLC separation columns available from Dionex Corporation of Sunnyvale, Calif. As disclosed herein it is demonstrated that polymer-functionalized nanocrystals can be organized into robust particle array structures with precisely controlled microstructure (that is, particle center-to-center distance) and polymer-like mechanical characteristics. Parallel advances in the understanding of the structure-property relations of robust CdSe-based core-shell QDs as well as the development of polymer microforming techniques set the stage for a transformative new bottom-up approach towards the scalable and cost-efficient production of QD-based full-color luminescent panels with advanced microstructural control and enhanced thermal and mechanical stability. In this approach monochromatic QD-domains (required to increase output efficiency) are not generated by a multistep zone printing process of individual domains but rather by the controlled self-organization of mixtures of polymer-grafted QDs (where distinct color QDs are grafted with distinct polymers providing access to control both thermal and mechanical properties) into monochromatic domain structures.

This novel approach towards the fabrication of, for example, monochromatic QD-domain structures will alleviate several barriers for the scalable and cost-efficient fabrication of efficient QD-based RGB modules. First, the use of homogenous coating and self-assembly (rather than sequential zone printing) will facilitate a significant cost reduction of QD-based luminescent. Second, the use of polymer-grafted QD-materials will give rise to a series of secondary property enhancements that will further benefit the development of QD-based technologies, such as improved stability of ink formulations, high level of microstructural control in QD-assembly structures for optimized output characteristics, enhanced thermomechanical stability, as well as formability of QD-based composite materials.

In several embodiments hereof, a flexible colloidal crystal film is formed by grafting (for example, growing) polymer brushes on inorganic particles. In a number of such embodiments, generally uniform sized inorganic particles and generally uniform functionalization of the surfaces with initiators for a controlled copolymerization (exemplified by, for example, the ATRP procedure) are used to provide tethered copolymer chains with low PDI, controlled polydispersity or bimodal dispersity, each of which can assist in filling void space between larger brush particles. In a number of embodiments, the chain length exceeds a critical molecular weight that is dependent of inorganic particle size so that the tethered chains can interpenetrate and provide flexibility to polymer brushes while retaining order formation of a colloidal crystal.

Figures 12A, 12B, 12C:
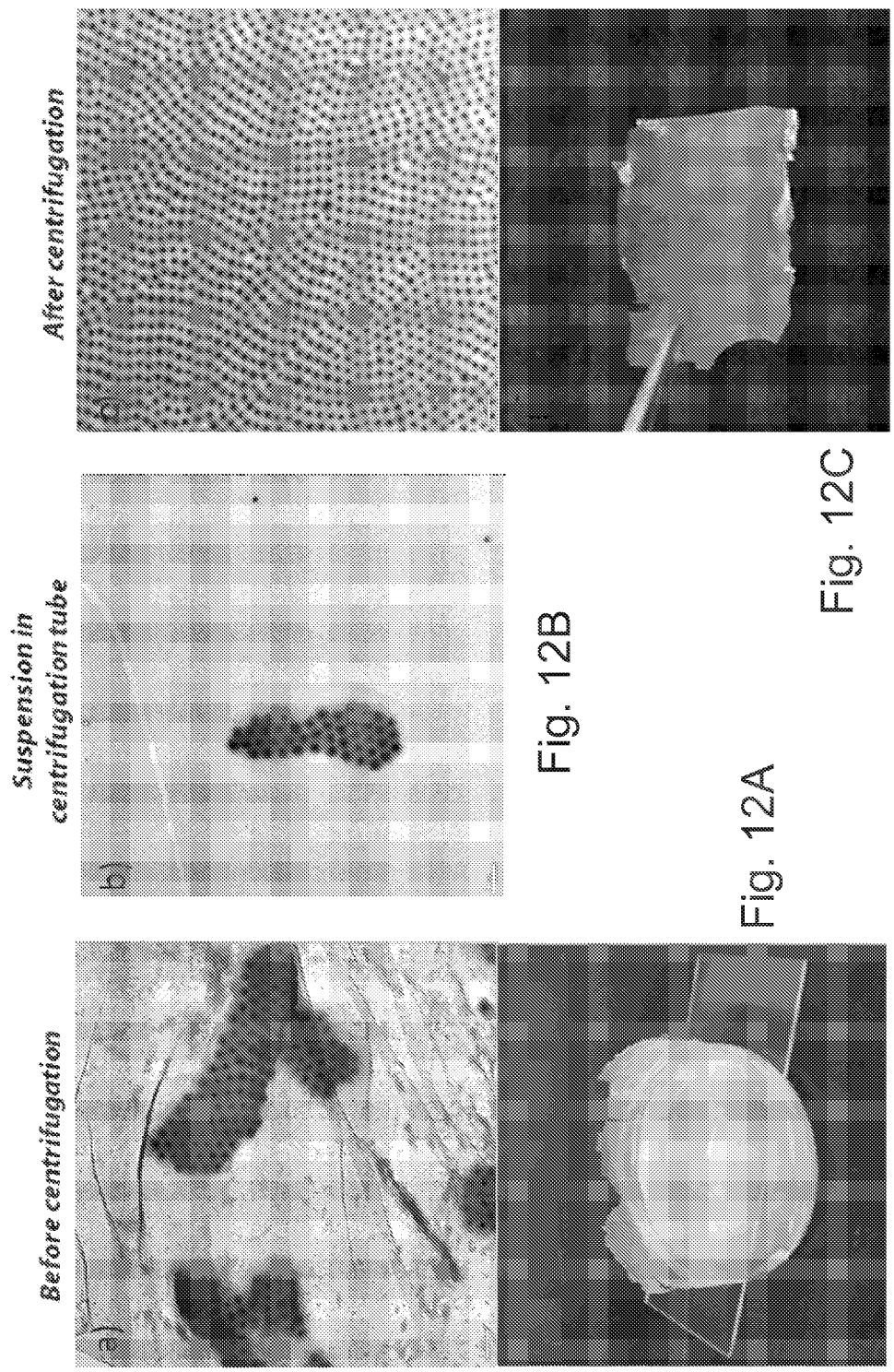
FIG. 12A illustrates a TEM image (upper) and an optical image (lower) of a free standing films of $SiO_{2,120\,nm}$-g-$PS_{2000}$ before centrifugation cycles.
FIG. 12B illustrates a TEM image of the sample present in the suspension layer of the centrifugation tube.
FIG. 12C illustrates a TEM image (upper) and an optical image (lower) of the residue layer after centrifugation cycles.

In several embodiments, to attain well defined order in the dispersed inorganic particles and crazing in the polymeric matrix, the amount of unbound or free polymer present was reduced or maintained below a threshold. Unbound or free polymer can significantly affect the arrangement of solid particles embedded in a free standing film. The need to control formation/retention of unbound polymer fragments is exemplified by studies on higher molecular weight $SiO_2$-g-PS samples where longer reaction times allows thermal self-initiation to form more unbound PS. See, FIGS. 12A through 12C which shows TEM images and optical images of free standing films of $SiO_{2,120\,nm}$-g-$PS_{2000}$ prepared by $SiO_2$—Br/St/CuCl/$CuCl_2$/PMDETA=1/5000/8/2/10 @70° C., where Br content on one gram of $SiO_2$ is 0.12 mmol FIG. 12A illustrates a TEM image and an optical image of the sample before centrifugation cycles. FIG. 12B illustrates a TEM image of the sample present in the suspension layer. FIG. 3 illustrates the residue layer after centrifugation cycles. Scale bars in the TM images are all 1 μm. In a number of embodiments, composition including the polymer brush systems hereof include greater than 50% of the material of the composition by mass. In other embodiments, composition including the polymer brush systems hereof include greater than 90% of the material of the composition or final product by mass.

In a number of embodiments hereof, bulk nanocomposite materials including particle brush systems (for example, having toughness exceeding 30% of the toughness of the free or unbound polymer with comparable molecular weight and equal chemical composition as the grafted polymer) are created by forming structures or compositions including predominantly the particle brush systems wherein the particle brush systems are close to or within the SDPB regime. In that regard, the degree of polymerization of the polymer brush may, for example, be no less the 10% less than a critical degree of polymerization and no more 20% greater than the critical degree of polymerization. As used above, "predominantly" refers to polymer nanocomposite materials in which the particle brush systems contribute more than 50% of the total material by mass. In a number of embodiments, the particle brush systems contribute more than 90% of the total material by mass. In a number of embodiments, SDPB may be defined on the basis of equation as a situation in which the total size of the particle brush exceeds the critical diameter $R_c$. In many embodiments, the presence of chain entanglements will require the particle brush to be in the SDPB. In other embodiments such as polydispersity of the grafted chains or bi- or multi-modal distributions of the molecular weight of polymer grafts assist in providing a fraction of higher molecular weight chains to fill the interstitial area. However, one should seek to maximize the number of interpenetrating chains to improve the toughness of the bulk material when a stressful environment is envisioned.

Examples and Discussion of Examples

Particle synthesis. Silica nanoparticles, 30% solution in methyl isobutyl ketone (MIBK-ST), effective diameter d≈15 nm, were kindly donated by Nissan Chemical Corp. and used as received. The ATRP initiator 1-(chlorodimethylsilyl)propyl-2-bromoisobutyrate was synthesized using the procedure reported in *Macromolecules* 1999, 32, 8716-8724. Styrene (Aldrich, 99%) and methyl methacrylate (MMA) were purified by passing through a basic alumina column. Copper(I) bromide (Aldrich, 98+%) and copper(I) chloride (Aldrich, 99+%) were purified by washing sequentially with acetic acid and diethyl ether, filtering and drying, and were stored under nitrogen before use. 4,4'-Dinonyl-2,20-bipyridine (dNbpy) (Aldrich, 99%), N,N,N',N'',N'''-pentamethyldiethylenetriamine (PMDETA) (Aldrich, 99%), anisole (Aldrich, 99%), and hydrofluoric acid (50 vol % HF, Acros) were used as received. All other chemicals and solvents were obtained from Aldrich and Acros Organics.

Tethering the ATRP Initiator on the Surface of the Particles.

The procedures for the synthesis of the exemplary silica particle tetherable ATRP surface initiator 1-(chlorodimethylsilyl)propyl 2-bromoisobutyrate and the subsequent functionalization of the silica particles, 30 wt % silica in methyl isobutyl ketone, 15 nm, effective diameter, Nissan Chemical Corp., were as performed according to methods described in incorporated papers.

The procedure can be applied to silica particles of any size with a radius from, for example, 0.04 nm to 2 microns. In the case of photonic and QD applications, in a number of embodiments, the particles are in the range of 0.1 nm-150 nm although materials with self-organized particle brush systems with a core radius of 500 nm have been fabricated, larger particles require higher molecular weight grafted chains to achieve SDPB. The procedures described herein are exemplary of procedures that can be applied to a wide range of surface chemistries such as metals metal oxides, ceramics etc.

Example of Growing Tethered Polymer Chains from Particles Using SI-ATRP.

Short chain PS-grafted silica nanoparticles ($SiO_2$-S10) were prepared by charging a Schlenk flask with 1.48 g initiator modified silica nanoparticles (0.353 mmol Br per g silica; 0.524 mmol ATRP initiator sites, product 1) and anisole (12.0 mL). The mixture was stirred for 24 h forming a clear homogeneous suspension. Styrene (6.0 mL, 52.4 mmol) and PMDETA ligand (21.9 mL, 0.105 mmol) were added to the flask. After three freeze-pump-thaw cycles, the mixture was immersed in liquid nitrogen and 15.0 mg (0.105 mmol) of CuBr was added, while the flask was filled with nitrogen gas. The flask was sealed with a glass stopper, evacuated and back-filled with nitrogen, five times. The reaction mixture was warmed to room temperature then the sealed flask was placed in an oil bath heated to 90° C. The polymerization was stopped by exposing the catalyst to the air after 5 h of reaction time. The product was precipitated by adding the reaction mixture to methanol and the solid was filtered and washed with methanol prior to drying in a vacuum oven at 60° C.

All other samples with N<1500 were prepared using similar synthetic procedures. The $SiO_2$-$MMA_{4000}$ nanocomposite was prepared in a similar way, however, in order to achieve a better control at a higher molecular region, the less active CuCl/dNbpy catalyst/ligand complex was used instead of the CuBr/PMDETA system, and the ratio of reagents was [$SiO_2$—$Br]_0$:[$MMA]_0$:[$CuCl]_0$:[$dNbpy]_0$=1:20 000:10:20.

Particles with surfaces modified with ultrahigh molecular weight polymers, exemplified by $SiO_2$-$MMA_{16k}$ were polymerized via activators generated by electron transfer for atom transfer radical polymerization (AGET-ATRP) under high pressure to enhance the propagation rate constant and reduce the termination rate constant when targeting very high molecular weight. The details of the high pressure procedure are described in *Macromol. Rapid Commun.* 2011, 32, 295-301.

Polystyrene standards with (number-average) molecular weight $M_n$=52 000 (dispersity index $M_w/M_n$=1.02) and $M_n$=300 000 (dispersity index $M_w/M_n$=1.2) were obtained from Polymer Source and used as received. Toluene solvent was obtained from Aldrich and used without further purification.

Table 1 above presents a summary of the composition of the particle brush system used in the present study. Note larger particles were used in later examples to examine the effect of decreased particle surface curvature.

Molecular weight and molecular weight distribution of surface-grafted chains were determined by gel permeation chromatography (GPC) after etching the silica in the composites with HF. The GPC was conducted with a Waters 515 pump, a Waters 410 differential refractometer (λ=930 nm) and a Wyatt Technology DAWN EOS multi-angle laser light scattering (MALLS) detector (30 mW, λ=690 nm) using Waters Microstyragel columns (guard, 102, 103, and 105 Å) in THF as an eluent (35° C., flow rate of 1 mL min$^{-1}$) The apparent molecular weights were determined with a calibration based on linear polystyrene and poly(methyl methacrylate) standards using GPCWin software from Polymer Standards Service. Absolute molecular weights were determined with the measured do/dc values using Wyatt ASTRA software.

Film Preparation and Analysis.

Essentially monolayer films of all particle brush systems were prepared by spin-casting of dilute particle solutions (1-3 mg mL$^{-1}$ in toluene) onto a poly(acrylic acid) (PAA) substrate and subsequent thermal annealing in a vacuum for 24 h at T=120° C. The equilibrium films were lifted off the PAA substrate by water immersion and transferred onto Cu-grids.

Thick films for nanoindentation were prepared by drop-casting of particle solutions with high concentration (10-20 mg mL$^{-1}$) onto a silicon substrate. The spatial distribution of particles was analyzed using ImageJ software.

Figure 11:
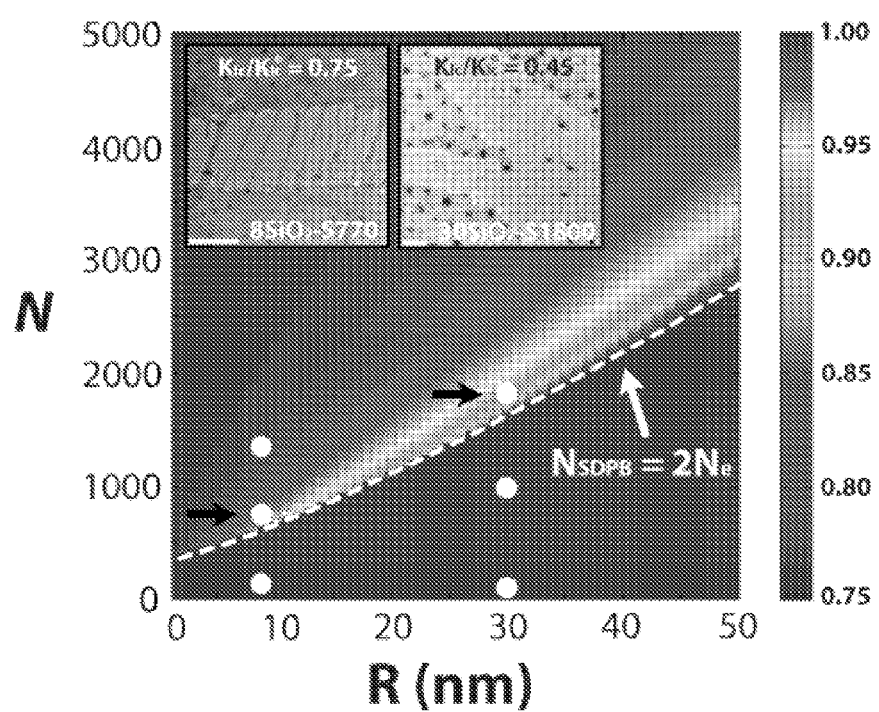
FIG. 11 Illustrates the dependence of effective entanglement density on the particle brush architecture such as degree of polymerization, particle size, and grafting density where white symbols represent the experimental results of the particle brush systems, dashed line denotes the criterion for the fragile-to-crazing transition based on the entanglement molecular weight in SDPB regime (i.e., NSDPB≥Ne), and the insets show the deformation characteristics of the PS-grafted particle brush assemblies, indicated by black arrows, revealing craze formation in particle solids in the SDPB regime (that is, 8SiO$_2$-S770 and 30SiO$_2$-S1800).

FIG. 11 illustrates the dependence of effective entanglement density on the particle brush architecture such as degree of polymerization, particle size, and grafting density where white, circular symbols represent the experimental results of the particle brush systems. The dashed line denotes the criterion for the fragile-to-crazing transition adopted herein based on the entanglement molecular weight in SDPB regime (that is, $N_{SDPB}$≥$2N_e$). The insets show the deformation characteristics of the PS-grafted particle brush assemblies, indicated by black arrows, revealing craze formation in particle solids in the SDPB regime (i.e., $8SiO_2$-S770 and $30SiO_2$-S1800). The theoretically calculated entanglement density in the particle brush system as a function of both particle radius (R) and degree of polymerization (N) of surface-grafted chains, reveals that for a constant N the effective entanglement density decreases with increasing particle size. Once again, the dashed curve denotes the minimum degree of polymerization to facilitate chain entanglement that was adopted to predict the mechanical transitions (that is, fragile-to-crazing) of the particle brush system. While the prediction for the fragile-to-crazing transition is found to capture the transition to the polymer-like characteristics in the particle brush system (indicated by black arrows) as shown in the electron micrographs (see the inset of FIG. 11) exhibiting the craze formation of the particle brush monolayers regardless of particle size, a deviation of the toughness (see the inset FIG. 7B) observed for large particle system is not taken into account. In contrast, the consideration of the effective entanglement density within the particle film assemblies provides more detailed explanation, related to the dependence of the conformational constraints on the particle size, for the reduced toughness of larger particle systems compared to the small particle systems with similar amounts of chain segments for the entanglement.

Figure 13:
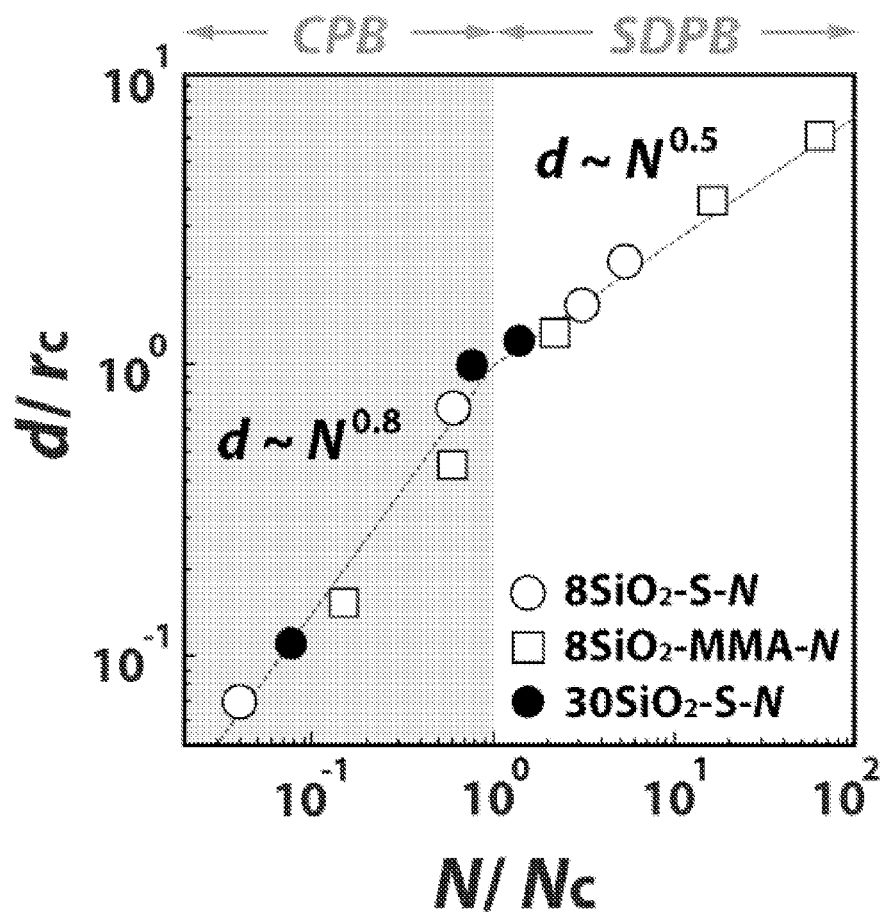
FIG. 13 illustrates the dependence of normalized particle surface-to-surface distance on the normalized degree of polymerization of polymer grafts determined by TEM of particle monolayers.

To determine the chain-conformational regime (CPB or SDPB) of the particle brush systems, the scaling relationship between the particle surface-to-surface distance and the degree of polymerization of surface-grafted chains (d~$N^x$) was determined by analysis of electron micrographs. The combined result is shown in FIG. 13 that depicts the scaling relationships in terms of the reduced parameters $d/r_c$, the reduced particle size, and $N/N_c$, the reduced degree of polymerization, where $r_c$ and $N_c$ are the expected critical brush radius and degree of polymerization at the CPB→SDPB transition based on the Daoud-Cotton-type scaling model described above (with $\rho_s$=0.6 nm$^{-2}$ and x=0.8 it follows that $N_c \cong$250 and 1280 for the particle system with $R_0 \cong$8 nm and 30 nm, respectively). FIG. 13 reveals that all particle systems exhibit a change in the scaling exponent x from x≅0.8 to x≅0.5 with increasing degree of polymerization of surface-grafted chains thus confirming the transition from stretched to relaxed chain conformations. The transition between the scaling regimes is found to be in good agreement with the predicted CPB→SDPB transition that is indicated as the border line between the differently shaded regions. This confirms the ability of the scaling model to capture structural transitions in particle brush systems within the experimental uncertainty. By adopting the Daoud-Cotton-type scaling model, the respective segment lengths of surface grafted chains that are associated with the stretched and relaxed regimes can be determined for each particle brush system using the data shown in FIG. 13. This will become an important aspect for the interpretation of the effect of polymer graft-modification on the order formation in particle brush assemblies that form robust well-ordered composite structures.

Nanoindentation.

Mechanical properties such as elastic modulus, hardness, and fracture toughness were measured by nanoindentation experiments using an MTS Nanoindenter XP with a Berkovich tip under displacement control to not more than ~10% of the nanocrystal film thickness. For PS reference samples experiments were performed at varied load rates (1-25 nm s$^{-1}$) to exclude load rate dependence of the results. Experimental data of particle brush samples were obtained from at least 20 indentations per sample from which the experimental error was determined by the standard deviation of the measurements. The displacement rate during the indentation was 5 nm s$^{-1}$ to a maximum load, followed by a constant load indentation for 20 seconds. In order to analyze the residual impression formed by indentation, the fracture surfaces were scanned in a tapping mode using an atomic force microscope (AFM, NT-MDT Explorer) with a silicon cantilever (5.1 N m$^{-1}$ force constant) with sharpened pyramidal tip.

Electron Microscopy.

Both the particle film morphology and its craze formation were imaged by transmission electron microscopy (TEM) using a JEOL EX2000 electron microscope operated at 200 kV. Imaging was taken by amplitude and phase contrast, and images were acquired using a Gatan Orius SC600 high-resolution camera.

Dynamic Light Scattering.

Hydrodynamic radii of PS-grafted particle brushes in toluene solution (c=1 mg mL) were determined by dynamic light scattering (DLS) analysis using a Malvern Zetasizer Nano ZS. Hydrodynamic radii are reported as number averaged values.

Importance of Washing Away, or not Forming, Unbound Polymer to Form a Well Ordered Structure.

Unbound polymer can significantly affect the arrangement of silica particles embedded in a free standing film. The effect is especially serious when targeting high molecular weight $SiO_2$-g-PS samples as longer reaction times allows thermal self-initiation to form more unbound PS. For example, after 1 week synthesis at 70° C., we can observe many impurities in the targeted $SiO_2$-g-$PS_{2000}$ (TEM image shown in FIG. 12A). In fact, the TEM is worse than expected. If we use kinetic prediction, the amount of thermal initiated unbound polymer should not exceed 50 vol %, preferentially less than 10%. In the presence of a larger excess of free polymer impurities, as shown in FIG. 12A, particles are highly aggregated and the fraction of silica particles therefore is also low in the free standing film sample. Therefore, centrifugation cycles were performed and both suspension and residue were taken and cast as free standing films. In the TEM of the free standing film made from the suspension layer a tiny amount of aggregated silica particles can be observed, but they are mostly just impurities. See FIG. 12B. In contrast, when the free standing film made from the residue layer the TEM showed highly organized and well defined structure. See FIG. 12C. The associated optical image showed a very beautiful Tyndall effect in contrast to the white film of the initial sample (FIG. 12A).

MW and Particle Size Effects of the Degree of Order in Hybrid Assemblies.

Molecular weight of the tethered graft polymer chains and particle size of the inorganic core are factors defining the polymer/SiNPs ratio (that is, a measure for the polymer radius of gyration relative to the particle size). As the polymer volume increases beyond the free volume required to form a close packed hexagonal structure, meaning that when the polymer already filled up the particle gap and extended to the interspace of well packed particles, the order of particles in the hybrid assemblies will be broken (see FIG. 9A) resulting in a transition from fragile to a coherent matrix exhibiting crazing during fracture. See FIG. 9B.

A Crazing and Order Region.

Surprisingly, when the calculated transitions for the order-disorder and the fragile-crazing plots are superimposed on each other there is an overlapping intermediate area between order/disorder and flexible (crazing)/fragile as illustrated in FIG. 9C. A comparison of both predicted transitions, order-disorder and fragile/crazing, and the existence of this intermediate space between the two domains that can be interpreted as a crazing-order region shows the feasibility of designing particle brushes that are capable of self-organizing into ordered yet mechanically tough film structures.

Results and Discussion.

As predicted from our interpretation of FIG. 9C, $SiO_{2,120\ nm}$-g-$PS_{700}$ and $SiO_{2,120\ nm}$-g-$PS_{2300}$ with grafting density ~0.5 chains/nm$^2$ forms a very well ordered structures. See FIG. 8. The free standing self-assembly films were formed by thermal annealing of particle hybrid samples on PAA. PAA was then removed by water. On the left, are TEM images of the free standing films. On the right, are optical images of the same free standing films. Neat particles and $SiO_{2,120\ nm}$-g-$PS_{700}$ do not show any crazing behavior (see FIGS. 8A and 8B, respectively), while crazing behavior can be observed for a film formed from $SiO_{2,120\ nm}$-g-$PS_{2300}$ (see FIG. 8C). Although the crazing behavior is small in $SiO_{2,120\ nm}$-g-$PS_{2300}$, some degree of flexibility can be observed. Moreover, in both cases, order formation and very beautiful diffraction patterns are also observed.

Tetherable ATRP Initiators for Other Particles.

Similar to the modifications of other inorganic metals with ATRP initiators, functionalization of hard acid metals nanoparticles can be carried out using an initiator that contains both an anchoring group selected for the targeted particle (e.g. carboxylic acid) and an ATRP initiator moiety (e.g. bromoisobutyrate). This type of modification has been done on $TiO_2$, ZnO, $Fe_2O_3$, CoO nanoparticles. Other particles including Au, Fe, Si, $ZnO_2$, CdS, and zeolites can be functionalized in a similar manner.

The foregoing description and accompanying drawings set forth a number of representative embodiments at the present time. Various modifications, additions and alternative designs will, of course, become apparent to those skilled in the art in light of the foregoing teachings without departing from the scope hereof, which is indicated by the following claims rather than by the foregoing description. All changes and variations that fall within the meaning and range of equivalency of the claims are to be embraced within their scope.

REFERENCES

Choi, J.; Hui, C. M.; Pietrasik, J.; Dong, H.; Matyjaszewski, K.; Bockstaller, M. R. *Soft Matter* 2012, 8, 4072-4082.

E. Wilmer, S. Soh, and B. A. Grzybowski, *Small,* 2009, 5, 1600-1630.

Y. Min, M. Akbulut, K. Kristiansen, Y. Golan, and J. Israelachvili, *Nat. Mater.,* 2008, 7, 527 538.

L. Pauchard, B. Abou, and K. Sekimoto, *Langmuir,* 2009, 25, 6672-6677.

A. T. Ngo, J. Richardi, and M. P. Pileni, *Nano Lett.,* 2008, 8, 2485-2489.

Mueggenburg, K. E.; Lin, X.-M.; Goldsmith, R. H.; Jaeger, H. M. *Nat. Mater.* 2007, 6, 656-660.

Pyun, J.; Matyjaszewski, K. *Chemistry of Materials* 2001, 13, 3436-3448,

WO 2002028912,

Pyun, J.; Kowalewski, T.; Matyjaszewski, K. *Polymer Brushes* 2004, 51-68.

Bockstaller, M. R.; Lapetnikov, Y.; Margel, S.; Thomas, E. L. *J. Am. Chem. Soc.* 2003, 125, 5276-5277.

Bockstaller, M. R.; Thomas, E. L. *J. Phys. Chem. B* 2003, 107, 10017-10024.

Bombalski, L.; Listak, J.; Bockstaller, M. R. *Annu. Rev. Nano Res.* 2006, 1, 295-336.

Bombalski, L.; Dong, H.; Listak, J.; Matyjaszewski, K.; Bockstaller, M. R. *Advanced Materials* 2007, 19, 4486-4490.

Choi, J.; Dong, H.; Matyjaszewski, K.; Bockstaller, M. R. *J. Am. Chem. Soc.* 2010, 132, 12537-12539.

Ojha, S.; Beppler, B.; Dong, H.; Matyjaszewski, K.; Garoff, S.; Bockstaller Michael, R. *Langmuir* 2010, 26, 13210-5.

Daoud, M.; Cotton, J. P., *J. Physique,* 1982, 43, 531-538

Takeshi; *Macromolecules* (2000), 33(15), 5602-5607.

Yoshikawa, Chiaki; Goto, Atsushi; Ishizuka, Norio; Nakanishi, Kazuki; Kishida, Akio; Tsujii, Yoshinobu; Fukuda, Takeshi; Macromolecular Symposia (2007), 248, 189-198.

Ohno, Kohji; Morinaga, Takashi; Takeno, Satoshi; Tsujii, Yoshinobu; Fukuda, Takeshi; *Macromolecules,* (2007), 40(25), 9143-9150.

Ohno, K. *Polym. Chem.* 2010, 1, 1545-1551.

C. M Wijmans and E. B. Zhlina, *Macromolecules,* 1993, 26, 7214-7224.

J. M. H. M Scheutjens and G. J. Fleer, *J. Phys. Chem,* 1979, 83, 1619-1635.

J. M. H. M. Scheutjens and G. J. Fleer, *J. Phys Chem,* 1980, 93, 7417-7426.

F. A. M. Leermakers and J. M. H. M. Scheutjens, *J. Phys. Chem.,* 1989, 93, 7417-7426.

K. Barry Sharpless et al.; (*Angewandte Chemie International Edition* 40 (11): 2004-2021 (2001).

R. P. Wool, B.-L. Yuan and O. J. McGarel, *Polym. Eng. Sci.,* 1989, 29, 1340-1367.

Fogg, D. E., Radzilowski, L. H., Dabbousi, B. I., Schrock, R. R., Thomas, E. L, Bawendi, M. G., *Macromolecules,* 1997, 30: p. 8433-8439.

Fogg, D. E., Radzilowski, L. H., Dabbousi, B. O., Schrock, R. R., Thomas, E. L., Bawendi, M. G., *Macromolecules,* 1997, 30(3): p. 417-426.

Wu, M., Mukherjee P., Lamon D. Waldeck, D. H., *The Journal of Physical Chemistry C,* 2010, 114(13): p. 5751-5759.

Bombalski, L.; Dong, H.; Listak, J.; Matyjaszewski, K.; Bockstaller, M. R. *Advanced Materials* 2007, 19, 4486-4490.

Voudouris, P.; Choi, J.; Dong, H.; Bockstaller, M. R.; Matyjaszewski, K.; Fytas, G. *Macromolecules* 2009, 42, 2721-2728.

Choi, J.; Dong, H.; Matyjaszewski, K.; Bockstaller, M. R. *J. Am. Chem. Soc.* 2010, 132, 12537-12539.

Matyjaszewski, K; et al. *Macromolecules* 1999, 32, 8716-8724.

Pietrasik, J.; Hui, C. M.; Chaladaj, W.; Dong, H.; Choi, J.; Jurczak, J.; Bockstaller, M. R.; Matyjaszewski, K. *Macromol. Rapid Commun.* 2011, 32, 295-301.

Braunecker, W. A.; Matyjaszewski, K. *Prog. Polym. Sci.* 2007, 32, 93-146.

Matyjaszewski, K.; Xia, *J. Chem. Rev.* 2001, 101, 2921-2990.

Tsarevsky, N. V.; Matyjaszewski, K. *Chem. Rev.* 2007, 107, 2270-2299.

Patents

WO 2002028912

What is claimed is:

1. A method of forming a composition comprising adding together a plurality of particle brush systems wherein each of the particle brush systems comprises a particle and a polymer brush comprising a plurality of polymer chains attached to the particle, wherein the plurality of polymer chains of the polymer brush exhibit modeled variable chain conformations as the degree of polymerization of the polymer chains increases so that the polymer brush comprises a concentrated polymer brush region with stretched polymer chains and a semi-dilute polymer brush region with relaxed chains that is radially outside of the concentrated polymer brush region, wherein the degree of polymerization of the polymer brush is no less than 10% less than a critical degree of polymerization and no more than 20% greater than the critical degree of polymerization, wherein the critical degree of polymerization is defined as the degree of polymerization required to achieve a transition from the concentrated polymer brush region to the semi-dilute polymer brush region.

2. The method of claim 1 further comprising determining the critical degree of polymerization using a scaling model to determine a change in a scaling factor in a log-log plot of polymer brush height versus degree of polymerization.

3. The method of claim 1, wherein the composition comprises greater than 50% by mass of the particle brush systems.

4. The method of claim 1, wherein the composition comprises greater than 90% by mass of the particle brush systems.

5. The method of claim 1, wherein the composition exhibits a degree of toughness exceeding a toughness of a free polymeric material formed from a polymer having the same composition as the polymer brush and having a degree of polymerization within 5% of the degree of polymerization of the polymer brush.

6. The method of claim 1, wherein the polymer brush systems self organize to form a colloidal crystal.

7. The method of claim 6, wherein the degree of order of the colloidal crystal is sufficient so that the composition exhibits a reflectivity exceeding 0.3.

8. The method of claim 1, wherein the composition is two-dimensional or a three-dimensional (3D) periodic superlattice structures formed by self-assembly of the polymer brush systems.

9. The method of claim 1, wherein parameters of the composition are controlled via selection of polymer composition, particle size, polymer dispersity ($M_w/M_n$) and graft density.

10. The method of claim 9, wherein the polymer dispersity is no Greater than 2.

11. The method of claim 9, wherein the polymer dispersity is no greater than 1.5.

12. The method of claim 1, wherein the degree of polymerization of the polymer brushes is between 10 and 1,000,000.

13. The method of claim 1 where the radius of the particles is in the range of approximately 0.05 nm and 500 nm.

14. The method of claim 1 where the size dispersity of the particles is in the range of 1.01 to 2.0.

15. The method of claim 1 where the size dispersity of the particles is less than 1.25.

16. The method of claim 1, wherein graft density is in the range of approximately 001 to 1, chain/nm².

17. The method of claim 1 wherein the particle brush systems of the composition self assembles to provide a center-to-center interparticle distance that varies by no more than 30%.

18. The method of claim 1 wherein the particle brush systems of the composition self assembles to provide a center-to-center interparticle distance that varies by no more than 5%.

19. The method of claim 1 wherein the composition forms a photonic crystal system or an organized quantum dot system.

20. The method of claim 1 wherein the degree of polymerization of the polymer brush is no less than 5% less than the critical degree of polymerization and no more than 10% greater than the critical degree of polymerization.

21. The method of claim 2 further comprising determining the critical degree of polymerization $N_c$ using the equation $r_c - R_0 = \alpha N_c^x$ wherein $r_c$ is the critical chain length associated with the transition, $R_0$ is the particle radius, $\alpha$ is the length of a repeat unit of the polymer, and x is the scaling factor in the concentrated polymer brush regime, and wherein $r_c = R_0(\rho_s^*)^{1/2}(v^*)^{-1}$, wherein $\rho_s^* = \rho_s \alpha^2$, wherein $\rho_s$ is the grafting density, and $v^* = v/(4\pi)^{1/2}$, wherein v is the excluded volume parameter.

22. A method of forming a composition comprising adding together a plurality of particle brush systems wherein each of the particle brush systems comprises a particle and a polymer brush comprising a plurality of polymer chains attached to the particle, wherein the plurality of polymer chains of the polymer brush exhibit modeled variable chain conformations as the degree of polymerization of the polymer chains increases so that the polymer brush has a concentrated polymer brush region with stretched polymer chains and a semi-dilute polymer brush region with relaxed chains that is radially outside of the concentrated polymer brush region, wherein the volume fraction of polymer chains in the semi-dilute polymer brush region does not exceed the available void space of a close packed regular structure formed by adjacent polymer brush systems by greater than 20%.

23. A composition comprising a plurality of particle brush systems wherein each of the particle brush systems comprises a particle and a polymer brush comprising a plurality of polymer chains attached to the particle, wherein the plurality of polymer chains of the polymer brush exhibit modeled variable chain conformations as the degree of polymerization of the polymer chains increases so that the polymer brush comprises a concentrated polymer brush region with stretched polymer chains and a semi-dilute polymer brush region with relaxed chains that is radially outside of the concentrated polymer brush region, wherein the degree of polymerization of the polymer brush is no less than 10% less than a critical degree of polymerization and no more than 20% greater than the critical degree of polymerization, wherein the critical degree of polymerization is defined as the degree of polymerization required to achieve a transition from the concentrated polymer brush region to the semi-dilute polymer brush region.

24. The composition of claim 23, wherein the composition comprises greater than 90% by mass of the particle brush systems and the polymer chains have a polymer dispersity no greater than 1.5.

* * * * *